(12) United States Patent
Brooks et al.

(10) Patent No.: US 8,995,146 B2
(45) Date of Patent: Mar. 31, 2015

(54) ELECTRICAL ASSEMBLY AND METHOD

(75) Inventors: Andrew Simon Hall Brooks, Melbourn (GB); Timothy Allan Von Werne, London (GB)

(73) Assignee: Semblant Limited, London (GB)

( * ) Notice: Subject to any disclaimer, the term of this patent is extended or adjusted under 35 U.S.C. 154(b) by 228 days.

(21) Appl. No.: 13/527,305

(22) Filed: Jun. 19, 2012

(65) Prior Publication Data
US 2013/0033825 A1    Feb. 7, 2013

Related U.S. Application Data

(63) Continuation of application No. PCT/GB2011/000238, filed on Feb. 21, 2011.

(30) Foreign Application Priority Data

Feb. 23, 2010    (GB) ................................. 1003067.4
Mar. 6, 2012    (GB) ................................. 1203927.7

(51) Int. Cl.
*H05K 7/02*    (2006.01)
*H05K 7/06*    (2006.01)
*H05K 7/08*    (2006.01)
*H05K 7/10*    (2006.01)
*H05K 3/28*    (2006.01)

(52) U.S. Cl.
CPC .......... *H05K 3/284* (2013.01); *H05K 2201/015* (2013.01); *H05K 2203/095* (2013.01); *H05K 2201/10121* (2013.01)
USPC ........... 361/760; 361/761; 361/763; 174/350; 174/355

(58) Field of Classification Search
USPC ............................ 174/350–355; 361/760–764
See application file for complete search history.

(56) References Cited

U.S. PATENT DOCUMENTS

| | | |
|---|---|---|
| 3,649,475 A | 3/1972 | Degnan et al. |
| 3,737,339 A | 6/1973 | Alsberg et al. |
| 3,745,536 A | 7/1973 | Klehm, Jr. |
| 3,770,571 A | 11/1973 | Alsberg et al. |
| 3,931,454 A | 1/1976 | Sprengling |
| 4,136,225 A | 1/1979 | Feit et al. |
| 4,268,568 A | 5/1981 | Sard et al. |

(Continued)

FOREIGN PATENT DOCUMENTS

| | | | |
|---|---|---|---|
| DE | 4239324 | 11/1992 | ............ H01L 223/29 |
| DE | 4437573 | 6/1995 | ............ C09J 127/18 |

(Continued)

OTHER PUBLICATIONS

Communication from GB IPO regarding GB 0815095.5, Nov. 2008.

(Continued)

*Primary Examiner* — Tuan T Dinh
(74) *Attorney, Agent, or Firm* — Baker Botts L.L.P.

(57) ABSTRACT

An electrical or electro-optical assembly comprising a substrate comprising an insulating material, at least one conductive track present on at least one surface of the substrate, at least one electrical or electro-optical component connected to at least one of the at least one conductive track, and a continuous coating comprising one or more plasma-polymerized polymers completely covering the at least one surface of the substrate, the at least one conductive track and the at least one electrical or electro-optical component.

30 Claims, 16 Drawing Sheets

(56) References Cited

U.S. PATENT DOCUMENTS

| | | | |
|---|---|---|---|
| 4,311,749 | A | 1/1982 | Hiraiwa et al. |
| 4,369,287 | A | 1/1983 | Hutchinson et al. |
| 4,508,756 | A | 4/1985 | Senda et al. |
| 4,547,424 | A | 10/1985 | Suzuki |
| 4,591,659 | A | 5/1986 | Leibowitz |
| 4,640,866 | A | 2/1987 | Suzuki |
| 4,689,110 | A | 8/1987 | Leibowitz |
| 4,710,429 | A | 12/1987 | Bogan et al. |
| 4,755,911 | A | 7/1988 | Suzuki |
| 4,772,509 | A | 9/1988 | Komada et al. |
| 4,784,901 | A | 11/1988 | Hatakeyama et al. |
| 4,784,917 | A | 11/1988 | Tawara et al. |
| 4,800,243 | A | 1/1989 | Osawa et al. |
| 4,895,756 | A | 1/1990 | Suzuki |
| 4,911,771 | A | 3/1990 | Tanaka et al. |
| 4,975,319 | A | 12/1990 | Walles et al. |
| 5,043,221 | A | 8/1991 | Koleske |
| 5,141,702 | A | 8/1992 | Guenin et al. |
| 5,274,913 | A | 1/1994 | Grebe et al. |
| 5,294,519 | A | 3/1994 | Mori et al. |
| 5,352,762 | A | 10/1994 | Nagai et al. |
| 5,639,555 | A | 6/1997 | Bishop |
| 5,639,989 | A * | 6/1997 | Higgins, III .................. 174/386 |
| 5,734,008 | A | 3/1998 | Shirasaki et al. |
| 5,858,074 | A | 1/1999 | Cole et al. |
| 5,955,179 | A | 9/1999 | Kickelhain et al. |
| 6,183,883 | B1 | 2/2001 | Mori et al. |
| 6,238,774 | B1 | 5/2001 | Park et al. |
| 6,284,308 | B2 | 9/2001 | Seki et al. |
| 6,335,224 | B1 | 1/2002 | Peterson et al. |
| 6,365,841 | B1 | 4/2002 | Takigami |
| 6,540,866 | B1 | 4/2003 | Zhang et al. |
| 6,589,639 | B2 | 7/2003 | Farquhar et al. |
| 6,650,013 | B2 | 11/2003 | Yin et al. |
| 6,740,816 | B2 | 5/2004 | Treutlein et al. |
| 6,785,389 | B1 | 8/2004 | Sella et al. |
| 6,803,092 | B2 | 10/2004 | Pocius et al. |
| 6,852,931 | B2 | 2/2005 | Hedler et al. |
| 6,861,092 | B2 | 3/2005 | McCarthy et al. |
| 6,924,008 | B2 | 8/2005 | Takai et al. |
| 6,941,978 | B2 | 9/2005 | Riffle |
| 7,045,198 | B2 | 5/2006 | Nakagiri et al. |
| 7,112,265 | B1 | 9/2006 | McAleer et al. |
| 7,176,402 | B2 | 2/2007 | Okumura et al. |
| 7,195,857 | B2 | 3/2007 | Tamura et al. |
| 7,327,040 | B2 | 2/2008 | Aoki et al. |
| 7,340,826 | B2 | 3/2008 | Hedler et al. |
| 7,396,591 | B2 | 7/2008 | Miyashita et al. |
| 7,396,596 | B2 | 7/2008 | Wessling |
| 7,465,478 | B2 | 12/2008 | Collins et al. |
| 7,527,915 | B2 | 5/2009 | Mutoh |
| 7,579,134 | B2 | 8/2009 | Dueber et al. |
| 7,635,016 | B2 | 12/2009 | Suzuki et al. |
| 7,673,970 | B2 | 3/2010 | Bertelsen et al. |
| 7,985,677 | B2 | 7/2011 | Fujii et al. |
| 8,004,860 | B2 * | 8/2011 | Salzman ....................... 361/818 |
| 8,008,588 | B2 | 8/2011 | Kaida et al. |
| 8,618,420 | B2 * | 12/2013 | Humphries et al. .......... 174/251 |
| 2002/0134588 | A1 * | 9/2002 | Dollarhite ..................... 175/374 |
| 2002/0168592 | A1 * | 11/2002 | Vezenov et al. ............... 430/320 |
| 2004/0026775 | A1 | 2/2004 | Hecht et al. |
| 2004/0186189 | A1 * | 9/2004 | Muller et al. .................... 521/27 |
| 2005/0121226 | A1 | 6/2005 | McKee et al. |
| 2005/0150685 | A1 | 7/2005 | Hedler et al. |
| 2006/0001700 | A1 * | 1/2006 | Bertelsen et al. ................ 347/50 |
| 2007/0258722 | A1 * | 11/2007 | Yu ................. 398/212 |
| 2008/0176096 | A1 | 7/2008 | Cheng |
| 2010/0025091 | A1 | 2/2010 | Ferdinandi |
| 2011/0186334 | A1 | 8/2011 | Humphries |
| 2011/0253429 | A1 | 10/2011 | Humphries |
| 2012/0257364 | A1 | 10/2012 | Brooks |
| 2013/0240256 | A1 | 5/2013 | Werne |
| 2013/0334292 | A1 | 7/2013 | Ferdinandi |

FOREIGN PATENT DOCUMENTS

| | | | |
|---|---|---|---|
| DE | 102007062787 | 7/2008 | ............. H01L 23/50 |
| EP | 0298204 | 5/1987 | ............. H05K 3/00 |
| EP | 0355955 | 6/1989 | ............. H01L 21/60 |
| EP | 0393832 | 3/1990 | ............. B23K 20/00 |
| EP | 0449292 | 3/1991 | ............. H05K 3/46 |
| EP | 0498258 A1 | 1/1992 | ............. H05K 3/46 |
| EP | 0498258 B1 | 1/1992 | |
| EP | 0710690 | 10/1995 | ............. C08G 73/10 |
| EP | 1091201 | 4/2001 | ............. G01L 9/00 |
| GB | 1287519 | 6/1970 | ............. H01L 1/10 |
| GB | 1399252 | 5/1971 | ............. H04M 1/23 |
| GB | 1484538 | 2/1974 | ............. C08G 59/62 |
| GB | 2285340 | 7/1995 | ............. H01H 13/70 |
| GB | 2453083 | 3/2009 | ............. H05K 3/28 |
| JP | 59097029 | 6/1984 | ............. G01L 9/04 |
| JP | 60257592 | 12/1985 | ............. B32B 15/088 |
| JP | 60258232 | 12/1985 | ............. B32B 15/08 |
| JP | 2120351 | 10/1988 | ............. C08L 27/12 |
| JP | 1131270 | 5/1989 | ............. C08L 27/12 |
| JP | 2086675 | 3/1990 | ............. C09J 7/04 |
| JP | 2167329 | 6/1990 | ............. H05K 1/03 |
| JP | 2285648 | 11/1990 | ............. H01L 21/60 |
| JP | 3129796 | 6/1991 | ............. H05K 3/46 |
| JP | 4208597 | 7/1991 | ............. H05K 3/42 |
| JP | 3242992 | 10/1991 | |
| JP | 3278494 | 12/1991 | ............. H05K 1/03 |
| JP | 8027453 | 7/1994 | ............. C09J 167/02 |
| JP | 06-232098 | 8/1994 | |
| JP | 8143846 | 11/1994 | ............. C09J 167/02 |
| JP | 7173251 | 7/1995 | ............. C08J 5/24 |
| JP | 7201502 | 8/1995 | ............. C09D 127/18 |
| JP | 7323501 | 12/1995 | ............. B23B 15/08 |
| JP | 8288331 | 11/1996 | ............. H01L 21/60 |
| JP | 11251356 | 9/1999 | ............. H01L 21/60 |
| JP | 11305430 | 11/1999 | ............. G03F 7/027 |
| JP | 11319635 | 11/1999 | ............. B05D 1/26 |
| JP | 2000211057 | 8/2000 | ............. H05K 3/46 |
| JP | 2003201571 | 1/2002 | ............. C23C 18/16 |
| JP | 2002329741 | 11/2002 | ............. H01L 21/60 |
| JP | 2003342311 | 12/2003 | ............. C08J 5/24 |
| JP | 2004184340 | 7/2004 | ............. G01N 27/46 |
| JP | 2005112981 | 4/2005 | ............. B32B 27/00 |
| JP | 2005161778 | 6/2005 | ............. B32B 27/18 |
| JP | 2005169538 | 6/2005 | ............. B23B 45/14 |
| JP | 2007100794 | 6/2005 | ............. G03F 7/027 |
| JP | 2007123370 | 10/2005 | ............. H05K 3/26 |
| JP | 2006-022400 | 1/2006 | |
| JP | 2006063315 | 3/2006 | ............. C08J 5/24 |
| JP | 2007084764 | 4/2007 | ............. C09D 145/00 |
| JP | 2007123712 | 5/2007 | ............. H05K 1/03 |
| JP | 2007129039 | 5/2007 | ............. H05K 1/03 |
| JP | 2007326956 | 12/2007 | ............. C08J 5/24 |
| JP | 2008294391 | 12/2008 | ............. H05K 3/10 |
| KR | 645641 | 5/2005 | ............. G03F 1/00 |
| WO | 87/07980 | 12/1987 | |
| WO | WO 97/11134 | 3/1997 | ............. C09D 145/00 |
| WO | WO 97/39610 | 10/1997 | ............. H05K 3/24 |
| WO | WO 98/58117 | 12/1998 | ............. D06M 10/02 |
| WO | WO 00/20130 | 4/2000 | ............. B05D 7/24 |
| WO | WO 03/002675 | 1/2003 | ............. C09D 5/44 |
| WO | WO 03/087224 | 10/2003 | ............. C08L 71/12 |
| WO | WO 2004/027115 | 4/2004 | ............. C23C 18/00 |
| WO | WO 2005/121101 | 12/2005 | ............. C07D 233/58 |
| WO | WO 2008/102113 | 8/2008 | ............. H05K 3/28 |
| WO | WO 2009/026284 | 2/2009 | ............. C09D 127/12 |
| WO | WO 2009/058732 | 5/2009 | ............. H05K 3/28 |
| WO | WO 2010/020753 | 8/2009 | ............. H05K 3/28 |

OTHER PUBLICATIONS

Communication from GB IPO regarding GB 0815094.8, Dec. 2008.
Communication from GB IPO regarding GB 0815096.3, Apr. 2009.
Communication from GB IPO regarding GB 0815096.3 Claim 9, Sep. 2009.

(56) References Cited

OTHER PUBLICATIONS

Communication from GB IPO regarding GB 0815096.3 Claim 11-13, Sep. 2009.
Communication from GB IPO regarding GB 0815096.3 Claim 14, Sep. 2009.
Communication from GB IPO regarding GB 0815096.3 Claim 16, Sep. 2009.
Communication IPO Examination Report under Sec. 18(3), UK App. No. GB 0815094.8; date of search May 31, 2011 (3 pgs).
Notification Transmittal International Search re PCT/GB2008/000552, Oct. 2008.
Notification Transmittal International Search re PCT/GB2009/001966, Nov. 2009.
Cabrera et al., *J. Vac. Sci. Technol.* A8(6), Nov./Dec. 1990, *Surface Analysis of Copper, Brass, and Steel Foils Exposed to Fluorine Containing Atmosphere*.
Deltschew et al., *Surface and Coating Technology* 142-144 (2001) 803-807, *Plasma Treatment Process for Fluxless Reflow Soldering*.
Stetter et al., *Journal of the Electrochemical Society*, 150(2) S11-S16 (2003), *Sensors, Chemical Sensors, Electrochemical Sensors, and ECS*.
Wolter et al., *Electronic Components and Technology Conference*, (2001), 1295-1298, *Plasma Treatment Process for Fluxless Reflow Soldering*.
Anonymous: *Circuit Board Soldering through Conformal Coating*, Research Disclosure, *Mason Publications*, Hampshire, GB, vol. 93, No. 68, Sep. 1, 1998, XP007112948, Issn: 0374-4353.

* cited by examiner

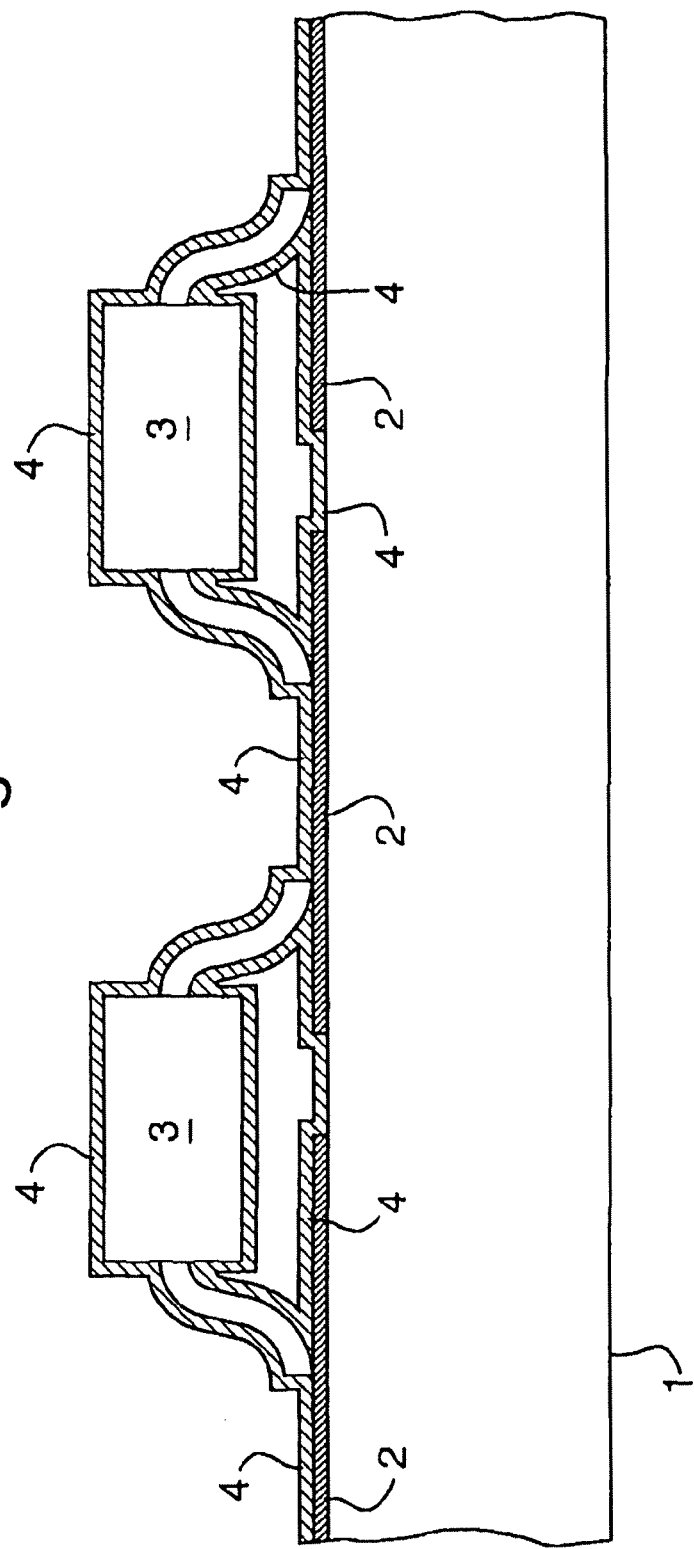

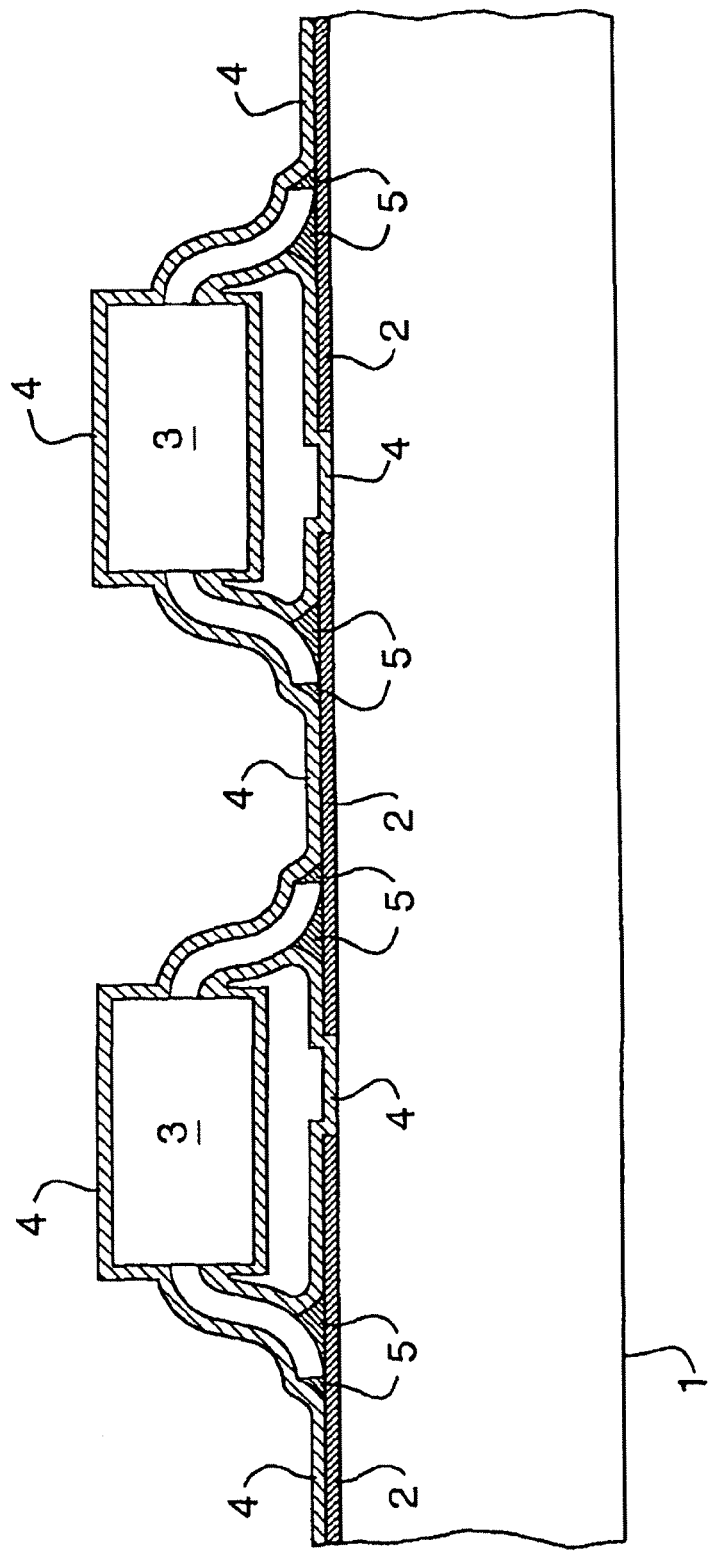

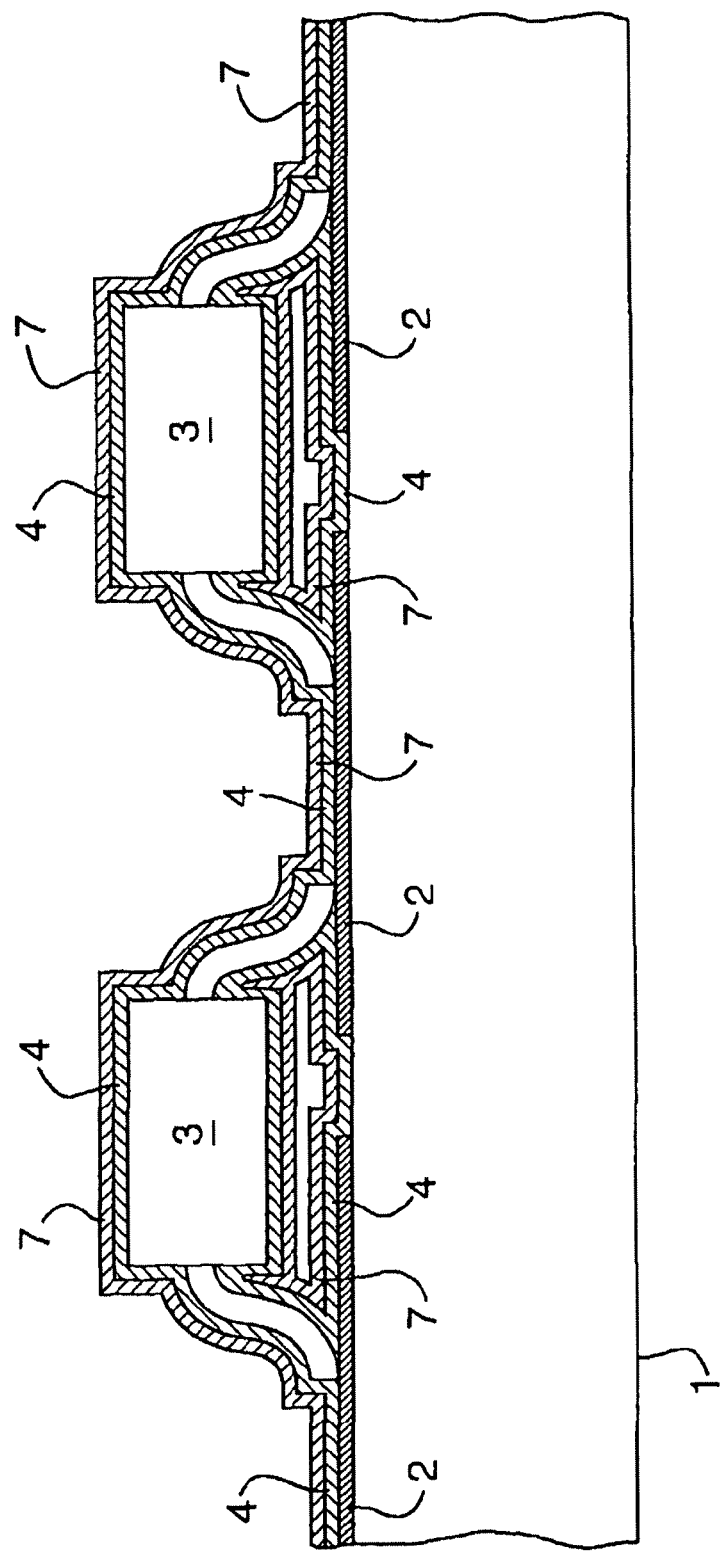

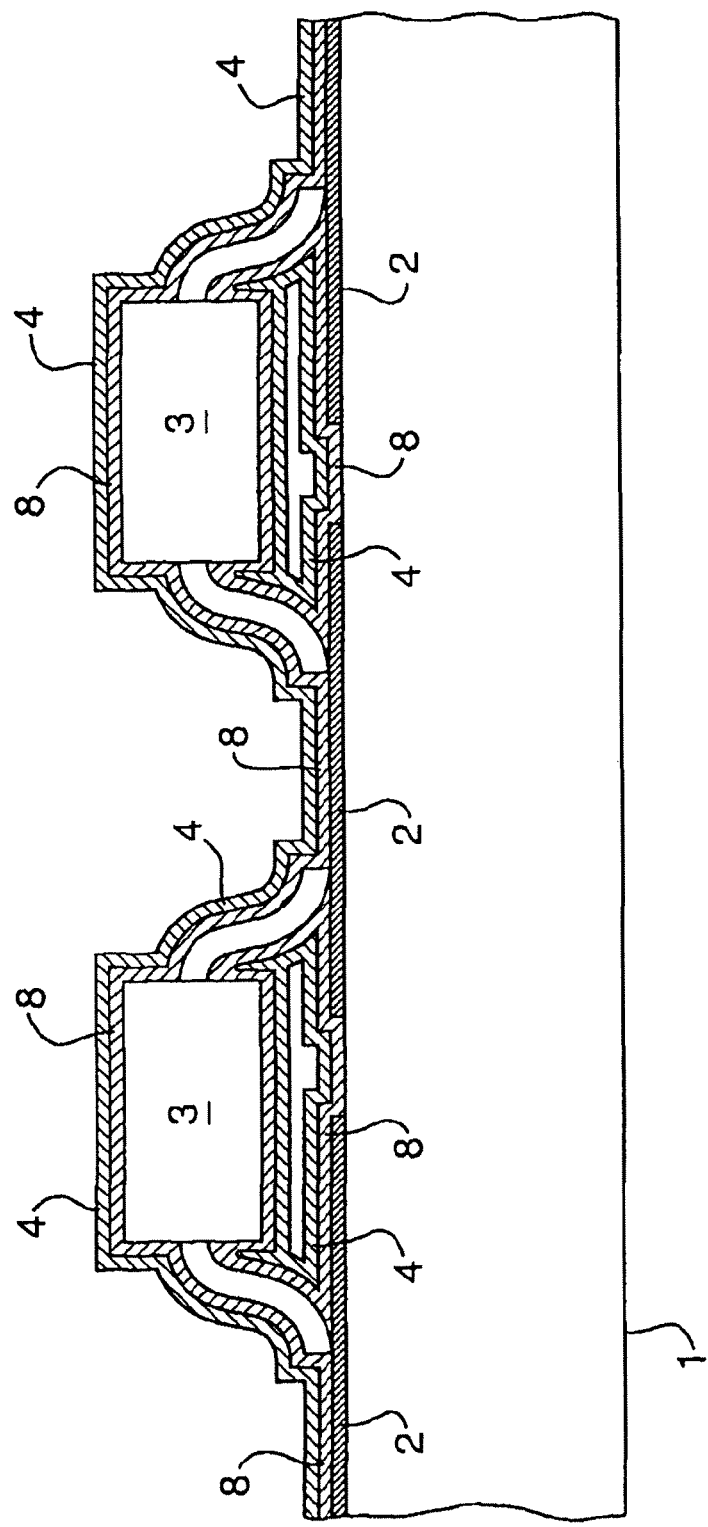

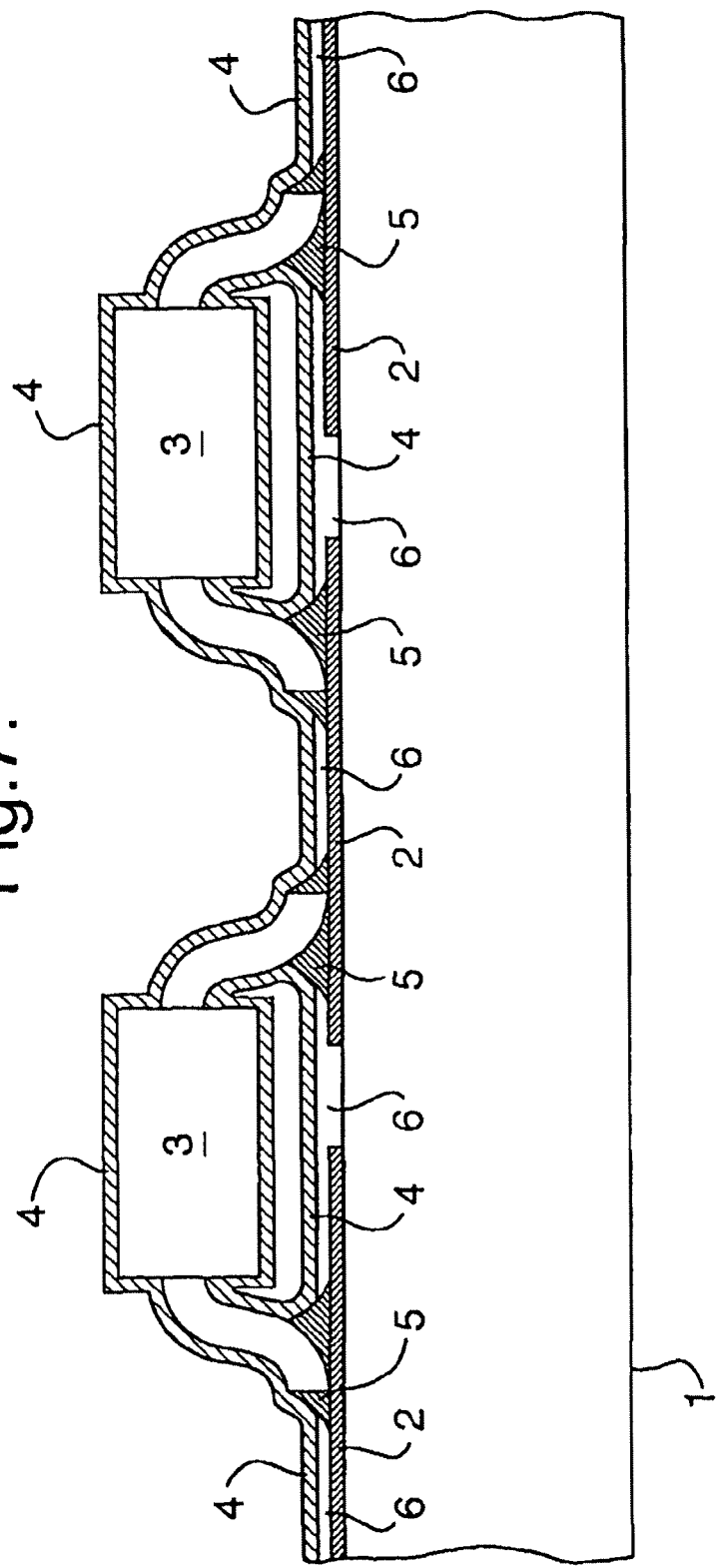

ELECTRICAL ASSEMBLY AND METHOD

RELATED APPLICATIONS

This application claims the benefit of Great Britain Application No. 1203927.7 filed Mar. 6, 2012 entitled "Plasma-Polymerized Polymer Coating" and is a continuation under 35 U.S.C. §111(a) of Application No. PCT/GB2011/000238 filed Feb. 21, 2011 entitled "Plasma-Polymerized Polymer Coating," which claims the benefit of Great Britain Application No. 1003067.4 filed Feb. 23, 2010 entitled "Plasma-Polymerized Polymer Coating."

TECHNICAL FIELD OF THE INVENTION

The present invention relates to a coated electrical assembly and to methods of preparing a coated electrical assembly.

BACKGROUND OF THE INVENTION

Conformal coatings have been used for many years in the electronics industry to protect electrical assemblies from environmental exposure during operation. A conformal coating is a thin, flexible layer of protective lacquer that conforms to the contours of an electrical assembly, such as a printed circuit board, and its components. Conformal coatings protect circuits from corrosive chemicals (for example salt, solvents, petrol, oils, acids and environmental pollutants), humidity/condensation, vibration, current leakage, electromigration and dendritic growth.

Current conformal coatings are typically 25 to 200 μm thick. There are 5 main classes of conformal coatings, according to the IPC definitions: AR (acrylic), ER (epoxy), SR (silicones), UR (urethanes) and XY (paraxylylene). Of these 5 types, paraxylylene (or parylene) is generally accepted to offer the best chemical, electrical and physical protection. However, the deposition process is time consuming and expensive, and the starting material is expensive. Parylene is typically deposited using conventional chemical vapor deposition techniques widely known to those skilled in the art.

Parylene is polymer with the following structure:

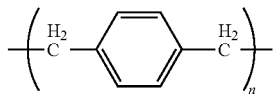

Parylene is deposited using a three stage vapor deposition process. A solid precursor is heated under vacuum and sublimes. It is important to appreciate that parylene, although sometimes erroneously called "paraxylene," is not in fact prepared from the compound paraxylene. In fact, the precursor is [2.2]paracyclophane:

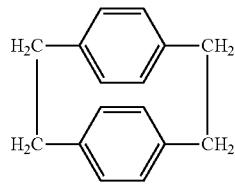

The chemical vapor is then passed through a high temperature furnace at around 680° C., so that the precursor splits into a reactive monomer. This reactive monomer then feeds into a deposition chamber and polymerizes on the surface of the substrate. Typical coating thicknesses for parylene are between 5 and 25 microns.

The parylene deposition technique described above is not ideal because of the high cost of the starting material, the high thermal energy consumption during monomer generation, the high vacuum requirements and the low growth rate.

There is therefore a need for conformal coatings that offer similar levels of chemical, electrical and physical protection as parylene, but that can be manufactured more easily and cheaply. In addition, there are a number of other disadvantages that may be associated with the current conformal coatings. The techniques used to deposit the coatings require that the contacts by which the assembly is connected to other devices are masked prior to coating, to prevent the conformal coating from covering the contacts. Coated contacts would not be able to make an electrical connection to other devices, since the conformal coating can be thick and insulating.

Furthermore, it may be very difficult and expensive to remove the current conformal coatings if reworking of the electrical assembly is required. There is no possibility of soldering or welding through the coatings, without prior removal. Additionally, due to the liquid techniques that are generally used to deposit these conformal coatings, there is a tendency for defects, such as bubbles, to form in the coating. These defects reduce the protective capabilities of the conformal coating. A further problem with prior art conformal coatings is that, due to the liquid techniques used during coating, it may be difficult to deposit the coating underneath components on the assembly.

SUMMARY OF THE INVENTION

The teachings of the present disclosure relate to an electrical or electro-optical assembly with a coating and a method for coating the assembly. In accordance with one embodiment, an electrical or electro-optical assembly has a substrate including an insulating material, at least one conductive track present on at least one surface of the substrate, at least one electrical or electro-optical component connected to at least one of the at least one conductive track, and a continuous coating comprising a plasma-polymerized polymer completely covering the at least one surface of the substrate, the at least one conductive tracks and the at least one electrical or electro-optical component.

In accordance with another embodiment, an electrical assembly has a substrate and a conformal coating deposited on at least one surface of the substrate by plasma polymerization of a first compound of formula (I) and deposition of a resulting polymer of the first compound of formula (I) onto the at least one surface of the substrate, and plasma polymerization of a first fluorohydrocarbon and deposition of a resulting polymer of the first fluorohydrocarbon onto the resulting polymer of the first compound of formula (I), wherein the compound of formula (I) has the following structure:

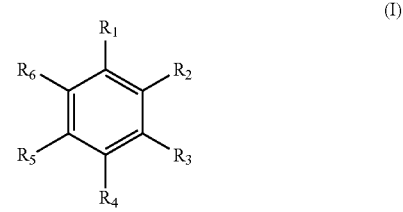

and wherein:

$R_1$ represents $C_1$-$C_3$ alkyl or $C_2$-$C_3$ alkenyl;
$R_2$ represents hydrogen, $C_1$-$C_3$ alkyl or $C_2$-$C_3$ alkenyl;
$R_3$ represents hydrogen, $C_1$-$C_3$ alkyl or $C_2$-$C_3$ alkenyl;
$R_4$ represents hydrogen, $C_1$-$C_3$ alkyl or $C_2$-$C_3$ alkenyl;
$R_5$ represents hydrogen, $C_1$-$C_3$ alkyl or $C_2$-$C_3$ alkenyl; and
$R_6$ represents hydrogen, $C_1$-$C_3$ alkyl or $C_2$-$C_3$ alkenyl.

Technical advantages of particular embodiments may include improved performance of the conformal coating, which may result in improved protection of the electrical assembly during operation.

BRIEF DESCRIPTION OF THE DRAWINGS

FIGS. 3 to 7 show electrical assemblies of certain embodiments.

DETAILED DESCRIPTION OF EXAMPLE EMBODIMENTS

Figure 1A:
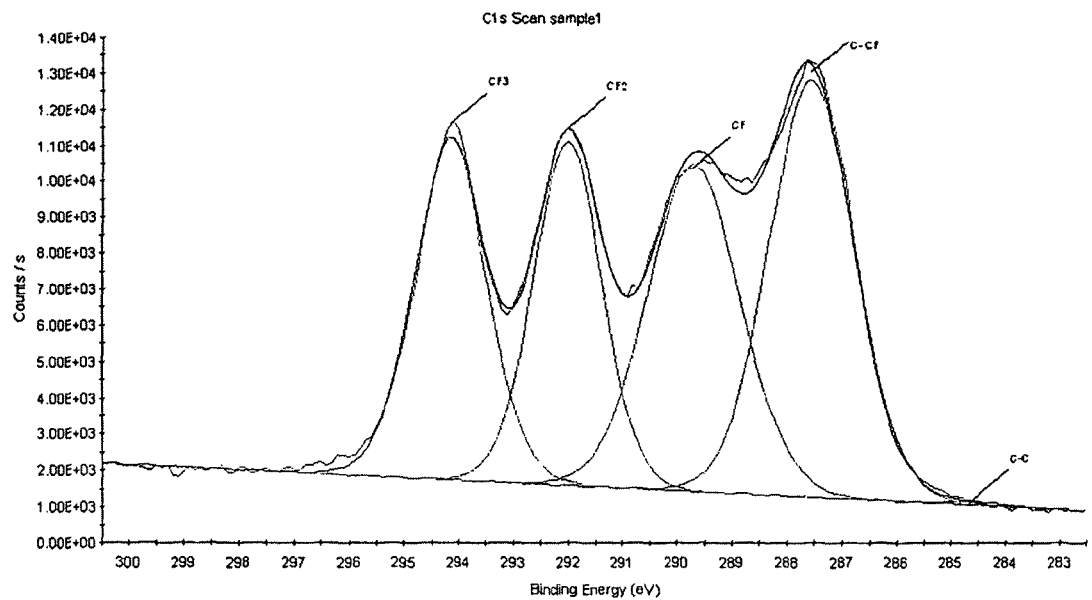
FIG. 1A shows the results of an X-ray photoelectron spectroscopic analysis of a plasma-polymerized fluoropolymer.

The present disclosure is concerned with electrical and electro-optical assemblies. An electrical assembly typically includes at least one electrical component. An electro-optical assembly typically includes at least one electro-optical component, and may optionally further include at least one electrical component. An electrical or electro-optical assembly may be a printed circuit board.

The continuous coating of the present invention comprises a plasma-polymerized polymer. The continuous coating of the present invention may prevent environmental damage to electrical or electro-optical assemblies. Environmental damage is typically caused by corrosion due to atmospheric components (for example oxygen, $SO_2$, $H_2S$, and/or $NO_2$) and/or moisture at ambient or elevated temperatures. Additionally, the continuous coating of the present invention may continue to protect the electrical and electro-optical assemblies to which it is applied over a greater temperature range than current conformal coatings, which may be degraded by higher temperatures.

In particular embodiments, a continuous coating is a conformal coating.

A conformal coating of the present disclosure may be obtained by plasma polymerization of specific precursor compounds and deposition of the resulting polymers. The polymerization reactions occur in situ. Polymerization, therefore, typically occurs on the surface at which deposition occurs. Polymerization and deposition are thus typically simultaneous.

Plasma-polymerized polymers are a unique class of polymers which cannot be prepared by traditional polymerization methods. Plasma-polymerized polymers have a highly disordered structure and are generally highly crosslinked, contain random branching and retain some reactive sites. Plasma-polymerized polymers are thus chemically distinct from polymers prepared by traditional polymerization methods known to those skilled in the art. These chemical and physical distinctions are well known and are described, for example in *Plasma Polymer Films*, Hynek Biederman, Imperial College Press 2004.

A plasma-polymerized polymer is typically obtainable by a plasma-polymerization technique, as defined in further detail below.

The plasma-polymerized polymer may include a plasma-polymerized hydrocarbon, halohydrocarbon, silicone, siloxane, silane, silazane or stannane.

A plasma-polymerized hydrocarbon may include a straight and/or branched polymer which optionally contains cyclic moieties. Said cyclic moieties may be alicyclic rings or aromatic rings. In certain embodiments, a plasma-polymerized hydrocarbon may not contain any cyclic moieties. In various embodiments, a plasma-polymerized hydrocarbon may be a branched polymer.

A plasma-polymerized halohydrocarbon may include a straight and/or branched polymer which optionally contains cyclic moieties. Said cyclic moieties may be alicyclic rings or aromatic rings. In various embodiments, a plasma-polymerized halohydrocarbon may not contain any cyclic moieties. In particular embodiments, a plasma-polymerized halohydrocarbon may be a branched polymer.

Plasma-polymerized hydrocarbons and halohydrocarbons including aromatic moieties may be plasma-polymerized aromatic hydrocarbons and aromatic halohydrocarbons (such as aromatic fluorohydrocarbons) respectively. Examples may include plasma-polymerized polystyrene and plasma-polymerized parylene. In various embodiments, the plasma-polymerized hydrocarbon may be parylene. The plasma-polymerized parylene may be unsubstituted or substituted with one or more substituents. Substituents may include halogens, which may be fluorine in certain embodiments. A parylene substituted with one or more halogen atoms is a haloparylene. A parylene substituted with one or more fluorine atoms is a fluoroparylene. In particular embodiments, parylene may be unsubstituted.

A plasma-polymerized hydrocarbon optionally contains heteroatoms selected from N, O, Si and P. In various embodiments, however, the plasma-polymerized hydrocarbon contains no N, O, Si and P heteroatoms.

A plasma-polymerized halohydrocarbon optionally contains heteroatoms selected from N, O, Si and P. In certain embodiments, however, the plasma-polymerized halohydrocarbon contains no N, O, Si, and P heteroatoms.

An oxygen-containing plasma-polymerized hydrocarbon may include carbonyl moieties, including ester and/or amide moieties. Oxygen-containing plasma-polymerized hydrocarbon polymers may be plasma-polymerized acrylate polymers.

An oxygen-containing plasma-polymerized halohydrocarbon may include carbonyl moieties, including ester and/or amide moieties. Oxygen-containing plasma-polymerized halohydrocarbon polymers may be plasma-polymerized haloacrylates polymers, for example plasma-polymerized fluoroacrylate polymers.

A nitrogen containing plasma-polymerized hydrocarbon may include nitro, amine, amide, imidazole, diazole, trizole and/or tetraazole moieties.

A nitrogen containing plasma-polymerized halohydrocarbon may include nitro, amine, amide, imidazole, diazole, trizole, and/or tetraazole moieties.

Plasma-polymerized silicones, siloxanes, silanes and silazanes are optionally substituted with one or more fluorine atoms. However, silicones, siloxanes, silanes, and silazanes may be unsubstituted. In various embodiments, silazane is hexamethyl disilazane.

In particular embodiments, the plasma-polymerized polymer is a plasma-polymerized halohydrocarbon, for example a plasma-polymerized fluorohydrocarbon. In certain embodiments, the plasma-polymerized polymer is a plasma-polymerized fluorohydrocarbon which may be branched and may not contain heteroatoms.

As used herein, the term halo may mean fluoro, chloro, bromo and iodo. In various embodiments, halo may mean fluoro and chloro. The term halogen takes the same meanings.

A plasma-polymerized fluorohydrocarbon may be obtained by plasma polymerization of one or more precursor compounds which are hydrocarbon materials comprising fluorine atoms. In various embodiments, hydrocarbon materials comprising fluorine atoms are perfluoroalkanes, perfluoroalkenes, perfluoroalkynes, fluoroalkanes, fluoroalkenes, fluoroalkynes. Examples include $C_3F_6$ and $C_4F_8$.

In certain embodiments, precursor compounds may be fluorochloroalkenes, fluorochloroalkenes and fluorochloroalkynes. Examples include $C_2F_3Cl$ and $C_2F_4Cl_2$.

A plasma polymerized parylene may be obtainable by plasma-polymerization of di-p-xylylene, xylylenes or xylenes.

Embodiments of the present disclosure may be prepared by depositing a polymer by plasma polymerization. Plasma-polymerization is generally an effective technique for depositing thin film coatings. Plasma-polymerization may provide excellent quality coatings, because the polymerization reactions occur in situ. As a result, the plasma-polymerized polymer generally may be deposited in small recesses, under components and in vias that would not be accessible by liquid coating techniques in certain situations.

In addition, the in situ formation of the polymer may provide good adhesion to the surfaces to which the coating is applied, since the polymer generally may react with the surfaces during deposition. Therefore, in certain situations, plasma-polymerized polymers may be deposited on materials which other conformal coatings may be deposited on only with difficulty or not at all.

A further advantage of the plasma-polymerization technique of the invention is that there is no need to dry/cure the coating following deposition. Prior art techniques for coating require a drying/curing step, which leads to formation of curing/drying defects on the surface of the coating. Plasma-polymerization avoids formation of curing/drying defects.

Plasma polymerization may be carried out in a reactor that generates a gas plasma which comprises ionized gaseous ions, electrons, atoms, and/or neutral species. A reactor may include a chamber, a vacuum system, and one or more energy sources, although any suitable type of reactor configured to generate a gas plasma may be used. The energy source may include any suitable device configured to convert one or more gases to a gas plasma. In particular embodiments, the energy source comprises a heater, radio frequency (RF) generator, and/or microwave generator.

In certain embodiments, an electrical or optical assembly may be placed in the chamber of a reactor and a vacuum system may be used to pump the chamber down to pressures in the range of 10-3 to 10 mbar. One or more gases may then be pumped into the chamber and an energy source may generate a stable gas plasma. One or more precursor compounds may then be introduced, as gases and/or liquids, into the gas plasma in the chamber. When introduced into the gas plasma, the precursor compounds may be ionized and/or decomposed to generate a range of active species in the plasma that polymerize to generate the polymer coating.

The exact nature and composition of the plasma-polymerized polymer coating typically depends on one or more of the following conditions (i) the plasma gas selected; (ii) the particular precursor compound(s) used; (iii) the amount of precursor compound(s) (which may be determined by the combination of the pressure of precursor compound(s) and the flow rate); (iv) the ratio of precursor compound(s); (v) the sequence of precursor compound(s); (vi) the plasma pressure; (vii) the plasma drive frequency; (viii) the pulse width timing; (ix) the coating time; (x) the plasma power (including the peak and/or average plasma power); (xi) the chamber electrode arrangement; and/or (xii) the preparation of the incoming assembly.

In certain embodiments, the plasma drive frequency is 1 kHz to 1 GHz. The plasma power may range from 100 to 10000 W. In particular embodiments, the plasma power may range from 500 to 10000 W or from 100 to 250 W. In various embodiments, the range may be 150 to 200 W, for example about 175 W. A person skilled in the art will recognize that an appropriate range may depend on the size of the plasma chamber.

In various embodiments, the mass flow rate may range from 5 to 2000 sccm. It may range, in particular embodiments, from 5 to 100 sccm or from 5 to 20 sccm, for example about 10 sccm. A person skilled in the art will recognize that an appropriate range may depend on the size of the plasma chamber.

In certain embodiments, the operating pressure may range from 10 to 500 mTorr. In various embodiments, the range may be from 10 to 100, mTorr, for example about 50 mTorr. A person skilled in the art will recognize that an appropriate range may depend on the size of the plasma chamber. Additionally, in particular embodiments, the coating time may be 10 seconds to 20 minutes.

Pulsed plasma systems may also be used.

However, as a skilled person will appreciate, these conditions may be dependent on the size and geometry of the plasma chamber. Thus, depending on the specific plasma chamber that is being used, it may be beneficial for the skilled person to modify the operating conditions.

The surface energy of the continuous coating can be controlled by careful selection of the precursors and the plasma processing conditions. Depending on the particular plasma polymer, the surface may be either hydrophilic or hydrophobic.

A hydrophobic coating may demonstrate a water contact angle of greater than 90 degrees, and more preferably greater than 105 degrees. A hydrophobic coating may demonstrate a surface energy of less than 35 dynes/cm, and in particular embodiments less than 30 dynes/cm. In certain situations, hydrophobic properties of the continuous coating may be highly desirable, since they may reduce the likelihood of damage to an assembly by moisture.

In some situations, however, a hydrophilic coating may be desirable. For example, hydrophilic coatings may be desirable if further coatings or labels (such as barcodes) are to be applied to the continuous coating. It is generally easier to adhere additional coatings to a hydrophilic coating. A hydrophilic coating may demonstrate a water contact angle of less than 70 degrees, and in various embodiments less than 55 degrees. A hydrophilic coating may demonstrate a surface energy of greater than 45 dynes/cm, and in particular embodiments greater than 50 dynes/cm.

As used herein, "continuous" means that the coating is substantially defect free. Possible defects may include holes, fissures and breaks in the coating. A continuous coating may be achieved using a plasma-polymerized polymer formed in situ on an electrical or electro-optical assembly. Using the plasma polymerization method described below, a continuous coating may be formed on all surfaces that are in contact with the plasma gas. This can be a particular advantage when coating high aspect ratio features such as components typically found on an electronic or electro-optical assembly. Using a plasma-polymerization method may also allow underhangs to be covered by the coating as well.

In various embodiments, a continuous coating may have a mean-average thickness of 1 nm to 10 μm, in particular embodiments it may be 1 nm to 5 μm or 5 nm to 500 nm or 100 nm to 300 nm or 150 nm to 250 nm, for example about 200 nm. The thickness of a continuous coating may be substantially uniform or may vary from point to point. In particular embodiments, the continuous coating may be deposited such that it conforms to the three-dimensional surface of the substrate, conductive tracks, and components.

A continuous coating may completely cover at least one surface of a substrate, a plurality of conductive tracks, and at least one electrical or electro-optical component. In certain embodiments, a coating may encapsulate the exposed portions of at least one surface of a substrate, a plurality of conductive tracks, and at least one electrical or electro-optical component. As mentioned previously, the continuous coating may be a conformal coating. A conformal coating may conformally coat at least one surface of a substrate, a plurality of conductive tracks, and the at least one electrical or electro-optical component. For the avoidance of doubt, references to coatings completely covering other items, as discussed below, are intended to take the same meanings as defined above.

The area of the electrical or electro-optical assembly which is completely covered with the continuous coating might, in some embodiments, be a portion of a larger electrical or electro-optical assembly, the remainder of which may not be coated.

A continuous coating may cause minimal or no change to electrical and/or optical performance of an assembly to which it is applied. For example, the inductance of an electrical circuit in an assembly may only be minimally affected by the coating. In some situations, this may be highly advantageous as compared to conformal coatings that may alter the properties of the circuit significantly, which may require the altered properties of the assembly caused by other coatings to be considered when an assembly is designed. The coating of particular embodiments may remove this requirement in some situations.

If a very high degree of protection from the environment is required for the electrical or electro-optical assembly, then additional continuous coatings of plasma-polymerized polymers may be applied over the initial continuous coating. Thus, the electrical or electro-optical assembly may further comprise a first additional continuous coating comprising a plasma-polymerized polymer as defined above which completely covers the continuous coating, and optionally a second additional continuous coating comprising a plasma-polymerized polymer as defined above which completely covers the first additional continuous coating. Further additional continuous coatings of plasma-polymerized polymers as defined above, for example third to tenth continuous coatings, may be applied, as necessary. The plasma-polymerized polymers used for each additional continuous coating may independently be the same as or different from the plasma-polymerized polymer of the initial continuous coating. Each additional continuous coating may be deposited by the methods used to deposit any, all, or some of the previous continuous coatings. The exact nature of the initial continuous coating and the any additional continuous coatings can be selected to improve or optimize the performance required from the coated assembly. For example, it may be desirable to have a highly hydrophobic coating as the uppermost coating, in order to achieve good resistance to moisture.

In particular embodiments with multiple coatings, the coatings may be thought of and described as multiple discrete coatings or as one coating with multiple discrete layers. For example, in various embodiments which include a coating with multiple discrete layers, a conformal coating may be formed by depositing a first polymer by plasma polymerization of a compound of formula (I), and then a second polymer by plasma polymerization of a fluorohydrocarbon. The resulting conformal coating will thus have two layers, which may be discrete layers. The first layer is in contact with surface of the electrical assembly and includes the polymer formed by plasma polymerization of the compound of formula (I). The second layer is in contact with the first layer and includes the polymer formed by plasma polymerization of the fluorohydrocarbon.

In various embodiments, the conformal coating may be formed by depositing a first polymer by plasma polymerization of a fluorohydrocarbon, and then a second polymer by plasma polymerization of a compound of formula (I). The resulting conformal coating will thus have two layers, which may be discrete layers. The first layer is in contact with surface of the electrical assembly and includes the polymer formed by plasma polymerization of the fluorohydrocarbon. The second layer is in contact with the first layer and includes the polymer formed by plasma polymerization of the compound of formula (I).

The deposition process may be repeated as often as desired, to build up a conformal coating having multiple layers, which may be discrete layers. Where two or more layers including a polymer formed by plasma polymerization of a compound of formula (I) are present, each compound of formula (I) used may be the same or different. Where two or more layers including a polymer formed by plasma polymerization of a fluorohydrocarbon are present, each fluorohydrocarbon used may be the same or different.

In certain embodiments, the polymer which is deposited last, that is to say the polymer that forms the upper or environmentally exposed surface of the conformal coating, may be obtained by plasma polymerization of a fluorohydrocarbon. In particular embodiments, the polymer which is deposited last, that is to say the polymer that forms the upper or environmentally exposed surface of the conformal coating, may be obtained by plasma polymerization of a compound of formula (I).

In various embodiments, the conformal coating may have at least four layers. This conformal coating may be obtained by (a) plasma polymerization of a first compound of formula (I) and deposition of the resulting polymer onto at least one surface of the electrical assembly, then (b) plasma polymerization of a first fluorohydrocarbon and deposition of the resulting polymer onto the polymer formed in step (a), then (c) plasma polymerization of a second compound of formula (I) and deposition of the resulting polymer onto the polymer formed in step (b), and then (d) plasma polymerization of a second fluorohydrocarbon and deposition of the resulting polymer onto the polymer formed in step (c). The compound of formula (I) and the fluorohydrocarbon may each respectively include one or more of the chemical compounds described herein. In various embodiments, the compound of formula (I) may include 1,4-dimethylbenzene and the fluorohydrocarbon may include hexafluoropropylene ($C_3F_6$).

In particular embodiments, the conformal coating may have at least six layers. This conformal coating may be obtained by (a) plasma polymerization of a first compound of formula (I) and deposition of the resulting polymer onto at least one surface of the electrical assembly, then (b) plasma polymerization of a first fluorohydrocarbon and deposition of the resulting polymer onto the polymer formed in step (a), then (c) plasma polymerization of a second compound of formula (I) and deposition of the resulting polymer onto the polymer formed in step (b), then (d) plasma polymerization of a second fluorohydrocarbon and deposition of the resulting polymer onto the polymer formed in step (c), then (e) plasma polymerization of a third compound of formula (I) and deposition of the resulting polymer onto the polymer formed in step (d), and then (f) plasma polymerization of a third fluorohydrocarbon and deposition of the resulting polymer onto the polymer formed in step (e). The compound of formula (I) and the fluorohydrocarbon may each respectively have one or more of the chemical compounds described herein. In various embodiments, the compound of formula (I) may include 1,4-dimethylbenzene and the fluorohydrocarbon may include hexafluoropropylene ($C_3F_6$).

In certain embodiments, the conformal coating may have at least eight layers. This conformal coating may be obtained by (a) plasma polymerization of a first compound of formula (I) and deposition of the resulting polymer onto at least one surface of the electrical assembly, then (b) plasma polymerization of a first fluorohydrocarbon and deposition of the resulting polymer onto the polymer formed in step (a), then (c) plasma polymerization of a second compound of formula (I) and deposition of the resulting polymer onto the polymer formed in step (b), then (d) plasma polymerization of a second fluorohydrocarbon and deposition of the resulting polymer onto the polymer formed in step (c), then (e) plasma polymerization of a third compound of formula (I) and deposition of the resulting polymer onto the polymer formed in step (d), then (f) plasma polymerization of a third fluorohydrocarbon and deposition of the resulting polymer onto the polymer formed in step (e), then (g) plasma polymerization of a fourth compound of formula (I) and deposition of the resulting polymer onto the polymer formed in step (0, and then (h) plasma polymerization of a fourth fluorohydrocarbon and deposition of the resulting polymer onto the polymer formed in step (g). The compound of formula (I) and fluorohydrocarbon may each respectively include one or more of the chemical compounds described herein. In various embodiments, the compound of formula (I) may include 1,4-dimethylbenzene and the fluorohydrocarbon may include hexafluoropropylene ($C_3F_6$).

In various embodiments, the conformal coating may have at least three layers. This conformal coating may be obtained by (i) plasma polymerization of a first fluorohydrocarbon of formula (I) and deposition of the resulting polymer onto at least one surface of the electrical assembly, then (ii) plasma polymerization of a compound of formula (I) and deposition of the resulting polymer onto the polymer formed in step (i), and then (iii) plasma polymerization of a second fluorohydrocarbon and deposition of the resulting polymer onto the polymer formed in step (ii). The compound of formula (I) and the fluorohydrocarbon may each respectively include one or more of the chemical compounds described herein. In certain embodiments, the compound of formula (I) may include 1,4-dimethylbenzene and the fluorohydrocarbon may include hexafluoropropylene ($C_3F_6$).

In particular embodiments, the conformal coating may have at least five layers. This conformal coating may be obtained by (i) plasma polymerization of a first fluorohydrocarbon of formula (I) and deposition of the resulting polymer onto at least one surface of the electrical assembly, then (ii) plasma polymerization of a first compound of formula (I) and deposition of the resulting polymer onto the polymer formed in step (i), and then (iii) plasma polymerization of a second fluorohydrocarbon and deposition of the resulting polymer onto the polymer formed in step (ii), then (iv) plasma polymerization of a second compound of formula (I) and deposition of the resulting polymer onto the polymer formed in step (iii), and then (v) plasma polymerization of a third fluorohydrocarbon and deposition of the resulting polymer onto the polymer formed in step (iv). The compound of formula (I) and the fluorohydrocarbon may each respectively include one or more of the chemical compounds described herein. In various embodiments, the compound of formula (I) may include 1,4-dimethylbenzene and the fluorohydrocarbon may include hexafluoropropylene ($C_3F_6$).

The thickness of the conformal coating in certain embodiments may depend upon the number of layers of each polymer that are deposited. In various embodiments, a layer obtainable by plasma polymerization of a compound of formula (I) may have a mean-average thickness of 250 to 350 nm. In particular embodiments, the mean-average thickness is in the range of 275 to 325 nm, for example about 300 nm. And in various embodiments, a layer obtainable by plasma polymerization of a fluorohydrocarbon may have a mean-average thickness of 25 to 100 nm. In particular embodiments, the mean-average thickness is in the range of 50 to 75 nm.

Thus, in certain embodiments, a conformal coating including one layer obtainable by plasma polymerization of a compound of formula (I) and one layer obtainable by plasma polymerization of a fluorohydrocarbon, may have a mean-average thickness of 275 to 450 nm. In various embodiments, the mean-average thickness may be 325 to 400 nm.

Similarly, in particular embodiments of a conformal coating including two layers obtainable by plasma polymerization of a compound of formula (I) and two layers obtainable by plasma polymerization of a fluorohydrocarbon, the mean-average thickness of the conformal coating may be 550 to 900 nm. In various embodiments, the mean-average thickness may be 650 to 800 nm.

In various embodiments, the thickness of the conformal coating may be substantially uniform or may vary from point to point.

Precursor compounds of formula (I) have the following structure:

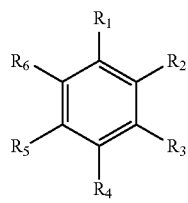

wherein $R_1$ represents $C_1$-$C_3$ alkyl or $C_2$-$C_3$ alkenyl; $R_2$ represents hydrogen, $C_1$-$C_3$ alkyl or $C_2$-$C_3$ alkenyl; $R_3$ represents hydrogen, $C_1$-$C_3$ alkyl or $C_2$-$C_3$ alkenyl; $R_4$ represents hydrogen, $C_1$-$C_3$ alkyl or $C_2$-$C_3$ alkenyl; $R_5$ represents hydrogen, $C_1$-$C_3$ alkyl or $C_2$-$C_3$ alkenyl; and $R_6$ represents hydrogen, $C_1$-$C_3$ alkyl or $C_2$-$C_3$ alkenyl.

As used herein, the term $C_1$-$C_3$ alkyl embraces a linear or branched hydrocarbon radical having 1 to 3 carbon atoms. In various embodiments, a $C_1$-$C_3$ alkyl may have 1 to 2 carbon atoms. Examples include methyl, ethyl, n-propyl and i-propyl.

As used herein, the term $C_2$-$C_3$ alkenyl embraces a linear or branched hydrocarbon radical having 2 or 3 carbon atoms and a carbon-carbon double bond. In certain embodiments, a $C_2$-$C_3$ alkenyl may be vinyl.

In various embodiments, $R_1$ may represent methyl or vinyl. $R_2$ may represent hydrogen, methyl or vinyl. $R_3$ may represent hydrogen, methyl or vinyl. $R_4$ may represent hydrogen, methyl or vinyl. $R_5$ may represent hydrogen, methyl or vinyl. $R_6$ may represent hydrogen, methyl or vinyl.

In particular embodiments, $R_5$ and $R_6$ may represent hydrogen.

In certain embodiments, $R_1$ may represent methyl or vinyl, $R_2$ may represent hydrogen, methyl or vinyl, $R_3$ may represent hydrogen, methyl or vinyl, $R_4$ may represent hydrogen, methyl or vinyl, $R_5$ may represent hydrogen and $R_6$ may represent hydrogen.

In particular embodiments, two of $R_2$ to $R_4$ may represent hydrogen.

Compounds of formula (I) may include 1,4-dimethylbenzene, 1,3-dimethylbenzene, 1,2-dimethylbenzene, toluene, 4-methyl styrene, 3-methyl styrene, 2-methyl styrene, 1,4-divinyl benzene, 1,3-divinyl benzene, or 1,2-divinyl benzene. In certain embodiments, the compound of formula (I) is 1,4-dimethylbenzene.

A fluorohydrocarbon is a hydrocarbon material including fluorine atoms. Fluorohydrocarbons may be perfluoroalkanes, perfluoroalkenes, perfluoroalkynes, fluoroalkanes, fluoroalkenes, and fluoroalkynes. In various embodiments, these compounds may contain up to 10 carbon atoms, and in certain embodiments up to five carbon atoms. Examples include $CF_4$, $C_2F_4$, $C_2F_6$, $C_3F_6$, $C_3F_8$, and $C_4F_8$. In various embodiments, the fluorohydrocarbon is hexafluoropropylene ($C_3F_6$).

In particular embodiments, the compound of formula (I) may include 1,4-dimethylbenzene, 1,3-dimethylbenzene, 1,2-dimethylbenzene, toluene, 4-methyl styrene, 3-methyl styrene, 2-methyl styrene, 1,4-divinyl benzene, 1,3-divinyl benzene, or 1,2-divinyl benzene, and fluorohydrocarbon may include $CF_4$, $C_2F_4$, $C_2F_6$, $C_3F_6$, $C_3F_8$, or $C_4F_8$. In various embodiments, the compound of formula (I) is 1,4-dimethylbenzene and the fluorohydrocarbon is hexafluoropropylene ($C_3F_6$).

In addition to embodiments where a new coating is created with several new layers, a plasma-polymerized coating may also be used to provide extra environmental protection to existing electrical or electro-optical assemblies which are coated with another conformal coating. This may be advantageous in situations where a water resistant outer coating is required or desired. Thus, the electrical or electro-optical assembly may further include a coating of an epoxy resin, an acrylic resin, a silicone resin, or a parylene deposited between at least a portion of the continuous coating of a plasma-polymerized polymer and at least a portion of a substrate, a plurality of conductive tracks and at least one electrical or electro-optical component. In certain embodiments, a parylene coating may be deposited by a chemical vapor deposition method.

Thus, in certain embodiments, an electrical or electro-optical assembly may include a substrate comprising an insulating material, a plurality of conductive tracks present on at least one surface of the substrate, at least one electrical or electro-optical component connected to at least one conductive track, a coating of an epoxy resin, an acrylic resin, a silicone resin, or a parylene (which may be deposited by traditional chemical vapor deposition methods) on at least a portion of the substrate, and a continuous coating comprising a plasma-polymerized polymer completely covering the at least one surface of the substrate, the plurality of conductive tracks, the at least one electrical or electro-optical component and the coating of an epoxy resin, an acrylic resin, a silicone resin or a parylene.

In various embodiments, the coating of an epoxy resin, an acrylic resin, a silicone resin, or a parylene is a conformal coating. Such an arrangement can be prepared by subjecting an electrical or electro-optical assembly including a coating of an epoxy resin, an acrylic resin, a silicone resin or a parylene deposited on at least a portion of the substrate, the plurality of conductive tracks and the at least one electrical or electro-optical component, to a coating method described herein.

In certain embodiments, a continuous coating may also be applied to electrical or electro-optical assemblies which carry a halohydrocarbon surface-finish coating as described in WO 2008/102113 (the content of which is incorporated herein by reference). Thus, an electrical or electro-optical assembly may include a surface-finish coating comprising a halohydrocarbon polymer deposited between (a) the continuous coating and (b) the at least one surface of the substrate and the plurality of conductive tracks, wherein the surface-finish coating covers at least a portion of the plurality of conductive tracks, and the at least one electrical or electro-optical component is connected to the at least one conductive track through the surface-finish coating. In particular embodiments, the surface-finish coating comprises a fluorohydrocarbon polymer, for example a plasma polymerized fluorohydrocarbon polymer.

In various embodiments, an electrical or electro-optical assembly may also include a substrate comprising an insulating material, a plurality of conductive tracks present on at least one surface of the substrate, at least one electrical or electro-optical component connected to at least one conductive track, a surface-finish coating including a halohydrocarbon polymer deposited on at least a portion of the plurality of conductive tracks, and a continuous coating including a plasma-polymerized polymer completely covering the at least one surface of the substrate, the plurality of conductive tracks, the at least one electrical or electro-optical component and the surface finish coating, where the at least one electrical or electro-optical component is connected to the at least one conductive track through the surface-finish coating.

In certain embodiments, the electrical or electro-optical component may be connected to the at least one conductive track via a solder joint, a weld joint, or a wire-bond joint and the solder joint, weld joint, or wire-bond joint abuts the surface-finish coating.

When an assembly includes a surface-finish coating or a coating of an epoxy resin, an acrylic resin, or a silicone resin, the assembly may be prepared by subjecting the assembly with the appropriate surface-finish coating or a coating of an epoxy resin, an acrylic resin, or a silicone resin to a coating method described above. Similarly, additional continuous coatings may be deposited as described above.

An advantage of plasma-polymerized coatings is that, in some situations, they may be easily removed by a plasma-removal process. A plasma removal process may involve plasma etching of the coating to expose the underlying surface of the electrical or electro-optical assembly. The coating may have a thickness around 200 nm. A traditional conformal coat applied to an electrical or electro-optical assembly using methods known in the prior art is typically between 25 and 200 μm thick. Removal of current conformal coatings can be time consuming and expensive using plasma etching because of the large volume of material to be removed. Thus, an electrical or electro-optical assembly as defined above can undergo a plasma-removal process. This plasma removal process typically removes substantially all of the continuous coating. Where present, it will typically remove substantially all of the additional continuous coatings and/or the surface-finish coating. A plasma-removal process typically involves placing the electrical or electro-optical assembly into a plasma chamber, and introducing a reactive gas plasma which chemically and/or physically bombards the surface of the coating to remove material and progressively etch back to the original underlying surface.

This process may be quick and inexpensive, and therefore advantageous. In certain embodiments, the electrical or electro-optical assembly from which the coating has been removed may then be re-worked, typically by addition of further components or replacement of existing components. Alternatively, the connection between conductive tracks and components may be reworked, if said connection has become damaged through use.

Once re-working is complete, a replacement continuous coating comprising a polymer may optionally be deposited by plasma-polymerization, which coating completely covers at least one surface of the substrate, a plurality of conductive tracks and at least one electrical or electro-optical component. Thus, in some situations, a damaged electrical or electro-optical assembly can be mended easily.

An advantage of a plasma-polymerized coating is that it may not be necessary to remove the coating prior to reworking. That is because, in some situations, it may be possible to solder through the coating. In various embodiments, it may also be possible to solder through an initial coating and, where present, the first and second additional coatings and/or a surface-finish coating, of an electrical or electro-optical assembly, to form a solder joint between a further electrical or electro-optical component and at least one conductive track. The solder joint may abut the continuous coating and, where present, the first and second additional coatings and/or the surface-finish coating.

In particular embodiments, an application involves removal of a surface-finish coating as described above by a plasma-removal process, followed by deposition of a plasma-polymerization polymer as described above. In various embodiments, an application involves removal of a surface-finish coating as described above by a plasma-removal process, then connecting electrical or electro-optical components to conductive tracks, followed by deposition of a plasma-polymerization polymer as described above.

In certain embodiments, an electrical or electro-optical assembly may include a plurality of conductive tracks that may be electrically conductive tracks or optically conductive tracks. In various embodiments, an electrically conductive track may include any suitable electrically conductive material. In particular embodiments, an electrically conductive track may include gold, tungsten, copper, silver, aluminum, doped regions of semi-conductor substrates, conductive polymers, and/or conductive inks.

Suitable shapes and configurations for the conductive tracks can be selected by a person skilled in the art for the particular assembly in question.

In certain embodiments, an electrically conductive track is attached to the surface of the substrate along its entire length. In various embodiments, an electrically conductive track may be attached to the substrate at two or more points. For example, an electrically conductive track may be a wire attached to the substrate at two or more points, but not along its entire length.

An electrically conductive track may be formed on a substrate using any suitable method known to those skilled in the art. In various methods, electrically conductive tracks may be formed on a substrate using a "subtractive" technique. In this method, a layer of metal (e.g., copper foil, aluminum foil, etc.) may be bonded to a surface of the substrate and then the unwanted portions of the metal layer are removed, leaving the desired conductive tracks. The unwanted portions of the metal layer may be removed from the substrate by chemical etching or photo-etching, milling. In certain methods, conductive tracks are formed on the substrate using an "additive" technique such as, for example, electroplating, deposition using a reverse mask, and/or any geometrically controlled deposition process. In particular embodiments, the substrate may include a silicon die or wafer, which may have doped regions as the conductive tracks.

In various embodiments, an optically conductive track may include any suitable optically conductive material. In certain embodiments, an optically conductive track is an optical wave guide, which may include an optically transmitting material where a change in refractive index is used to propagate the electromagnetic radiation through the desired path. The waveguide may be created, for example, by applying a cladding or boundary layer to the optically transmitting material, wherein the cladding or boundary layer is made of a material of different refractive index. In particular embodiments, a waveguide may be created by doping or modifying the optically transmitting material to create regions of variable refractive index. The waveguides can therefore be standalone components, or features integrated into a substrate. In certain embodiments, optically transmitting materials are glasses, doped glasses, and plastics.

In particular embodiments, the plurality of conductive tracks may comprise only electrically conductive tracks, only optically conductive tracks, or a mixture of electrically conductive tracks and optically conductive tracks. Where more than one electrically conductive track is present, each track may be made from the same material as defined above and/or have the same shape, or there may be a variety of track materials and/or track shapes. Where more than one optically conductive track is present, each track may be made from the same material as defined above and/or have the same shape, or there may be variety of track materials and/or track shapes.

In various embodiments, the plurality of conductive tracks may include at least one external-contact means and the continuous coating may partially or completely covers the at least one external-contact means.

In certain embodiments, the exact nature of the external-contact means may depend on the nature of the assembly and the device to which contact is required. Suitable contacts can be routinely selected by a person skilled in the art. In particular embodiments, the external-contact means is an electrical or optical contact. In various embodiments, the external-contact means may be a portion of the plurality of conductive tracks. In certain embodiments, the external-contact means may be an additional component which is electrically or optically connected to the at least one conductive track.

In various embodiments, a plasma-polymerized coating may allow an electrical connection to be made between (a) an external-contact means, preferably an electrical contact, and (b) corresponding contacts on an external device, without prior removal of the continuous coating. Similarly, a plasma-polymerized coating may allow an optical connection to be made between (a) an external-contact means, preferably an optical contact, and (b) corresponding contacts on an external device, without prior removal of the continuous coating. Therefore, in particular embodiments, it may not be necessary in to mask the external-contact means of the assembly prior to formation of the plasma-polymerized coating. In some embodiments, this may be advantageous since masking of external contact means may be time-consuming and expensive.

In certain embodiments, an electrical or electro-optical assembly may include a substrate that may include an insulating material. In particular embodiments, the substrate may include any suitable insulating material that prevents the substrate from shorting the circuit of electrical or electro-optical assembly. Thus, in an electrical assembly, the substrate may be electrically insulating. In particular electro-optical assemblies, the substrate may be both electrically insulating and optically insulating.

In certain embodiments, a substrate may include an epoxy laminate material, a synthetic resin bonded paper, an epoxy resin bonded glass fabric (ERBGH), a composite epoxy material (CEM), PTFE (Teflon), or other polymer materials, phenolic cotton paper, silicon, glass, ceramic, paper, cardboard, natural and/or synthetic wood based materials, and/or other suitable textiles. In particular embodiments, the substrate may also include a flame retardant material, typically Flame Retardant 2 (FR-2) and/or Flame Retardant 4 (FR-4). The substrate may be a single layer of an insulating material or multiple layers of the same or different insulating materials. The substrate may be the board of a printed circuit board (PCB) made of any one of the materials listed above.

In various embodiments, an electrical or electro-optical assembly includes at least one electrical or electro-optical component.

An electrical component may be any suitable circuit element of an electrical assembly. In various embodiments, an electrical component is a resistor, capacitor, transistor, diode, amplifier, antenna or oscillator. Any suitable number and/or combination of electrical components may be connected to the electrical assembly.

An electrical component may be connected to an electrically conductive track via a bond. The bond may be a solder joint, a weld joint, a wire-bond joint, a conductive adhesive joint, a crimp connection, or a press-fit joint. Suitable soldering, welding, wire-bonding, conductive adhesive, and press-fit techniques are known to those skilled in the art, for forming the bond. In certain embodiments, the bond is a solder joint, a weld joint, or a wire-bond joint, with a solder joint most preferred.

An electro-optical component may be a component in which an electromagnetic signal, i.e. an optical signal, is controlled electronically, for example in active switches, filters, modulators, amplifiers, and switchable elements. In various embodiments, an electro-optical component may be a component which converts electromagnetic signals, i.e. optical signals, to electronic signals and vice versa, such as light emitters, light detectors and detector arrays. An electro-optical component, thus, may be, a light emitting diode (LED), a laser LED, a photodiode, a phototransistor, a photomultiplier, or a photoresistor.

As a skilled person will appreciate, an electro-optical component may have an electrical input/output and an optical input/output. The electrical input/output may be connected to an electrically conductive track, preferably via a bond as defined above.

The optical input/output may be connected to an optically conductive track, and in certain embodiments, it may be connected via a bond.

In particular embodiments, the assembly may also include an optical component. An optical component may be a passive component. Passive components may include, for example, couplers, splitters, Y-splitters, star couplets, fibers, and optical switches. The optical component may be connected to an optically conductive track, and in various embodiments, it may be connected via a bond. The optical component and the bond, where present, may be partially or completely covered by a continuous coating.

In various embodiments, an optical connection may be achieved through an active or a passive mechanical structure, which optically aligns the component and conductive track and mechanically holds these in place. In certain embodiments, an optical connection may be made using adhesives. In particular embodiments, this may occur with selected/controlled refractive index. In various embodiments, an optical connection may be created by fusing the component and conductive track together. In particular embodiments, the refractive index of the material may be modified by, for example, doping with new materials, to create a new connection. In certain embodiments, in situ addition of suitable material may be applied to create new optical geometries.

In particular embodiments, an electrical assembly includes a substrate with an insulating material, multiple electrically conductive tracks present on at least one surface of the substrate, at least one electrical component connected to at least one electrically conductive track, possibly by at least one bond as defined above, and a continuous coating including a plasma-polymerized fluoropolymer completely covering the at least one surface of the substrate, the multiple electrically conductive tracks connected to the at least one electrical component and, where present, the at least one bond. In various embodiments, the electrically conductive tracks include at least one external contact means, which is typically at least one electrical contact, and the at least one external contact means is also completely covered by the continuous coating.

In certain embodiments, a printed circuit board includes a substrate including an insulating material, multiple electrically conductive tracks present on at least one surface of the substrate, at least one electrical component connected to at least one electrically conductive track by at least one solder joint, weld joint or wire-bond joint, and a continuous coating including a plasma-polymerized fluoropolymer completely covering the at least one surface of the substrate, the multiple electrically conductive tracks, the at least one electrical component and the at least one solder joint, weld joint or wire-bond joint.

In particular embodiments, a printed circuit board includes a substrate including an insulating material, multiple electrically conductive tracks, which include at least one external contact means, present on at least one surface of the substrate, at least one electrical component connected to at least one electrically conductive track by at least one solder joint, weld joint or wire-bond joint, and a continuous coating including a plasma-polymerized fluoropolymer completely covering the at least one surface of the substrate, the multiple electrically conductive tracks, the at least one external contact means, the at least one electrical component and the at least one solder joint, weld joint or wire-bond joint.

A continuous plasma-polymerized polymer coating may be useful for coating electrical or electro-optical components. Thus, an electrical or electro-optical component may be partially or completely covered with a continuous coating comprising a plasma-polymerized polymer as described above for an electrical or electro-optical assembly. A coated component may be prepared by subjecting the component to a coating method described above. A plasma-polymerized polymer coating may provide excellent environmental protection for the electrical or electro-optical component, and thus may be particularly useful in the case of high value components. In various embodiments, an electrical component may be completely covered with a continuous coating comprising a plasma-polymerized fluoropolymer.

In certain embodiments, the coated electrical or electro-optical components may be connected to at least one conductive track of an electrical or optical assembly without prior removal of the continuous coating, typically in the case of an electrical component by soldering or wire-bonding. In various embodiments, substantially all of the continuous coating may remain intact, and provide environmental protection post-installation. In particular embodiments, the coating may be removed by a plasma-removal process, prior to installation in an assembly.

In certain embodiments, one or more plasma-polymerized polymers as described above may be used to conformally coat an electrical or electro-optical assembly or an electrical or electro-optical component.

Aspects of the invention will now be described with reference to the exemplary embodiments shown in FIGS. 1 through 15, in which like reference numerals refer to the same or similar components.

Figure 1B:
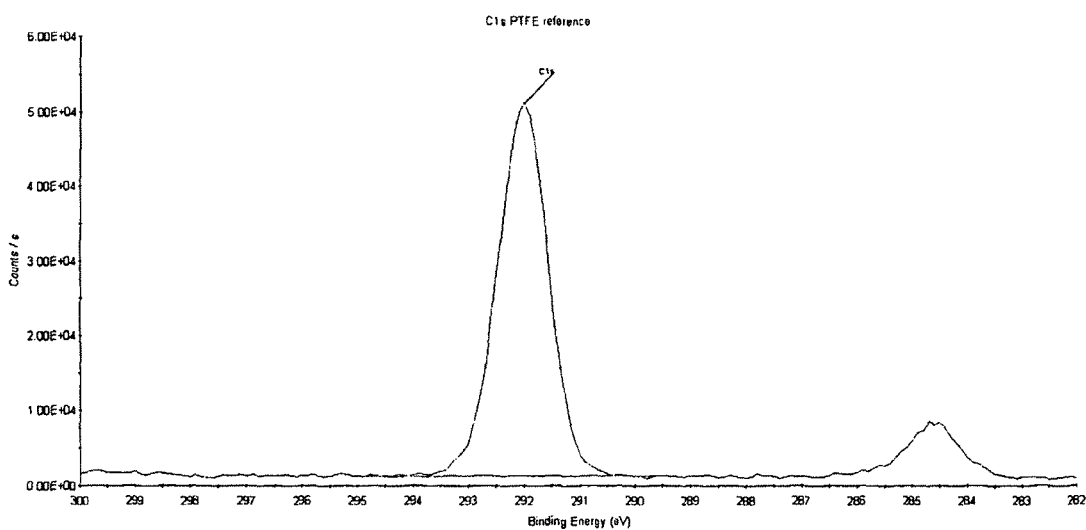
FIG. 1B shows the results of an X-ray photoelectron spectroscopic analysis of a fluoropolymer obtained by standard polymerization techniques.

FIG. 1A shows the results of an X-ray photoelectron spectroscopic analysis of a plasma-polymerized fluoropolymer. This shows that the plasma-polymerized fluoropolymer comprises a high proportion of $CF_3$, CF, and C—CF moieties, indicating a high degree of branching and cross-linking. FIG. 1B shows the results of an X-ray photoelectron spectroscopic analysis of a fluoropolymer obtained by standard polymerization techniques, namely commercially available PTFE. This shows that fluoropolymers obtained by standard polymerization techniques contain predominately the $CF_2$ moiety and negligible proportions of $CF_3$, CF, and C—CF moieties, indicating a very low degree of branching and cross-linking. The method by which these results were obtained is described in Example 1

Figure 2A:
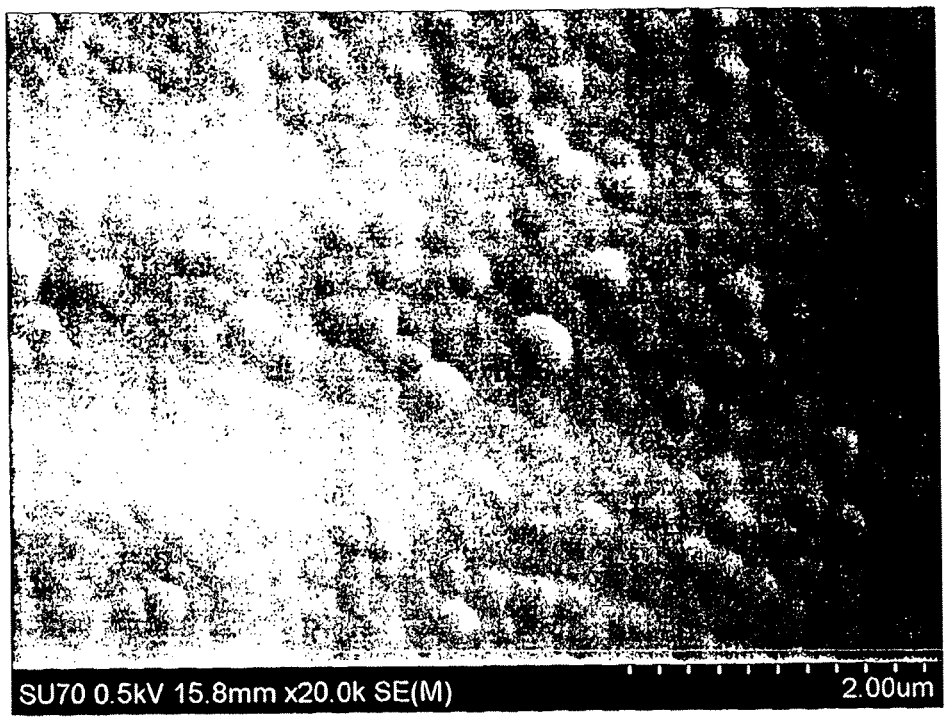
FIG. 2A shows an electron microscope image of a plasma-polymerized fluoropolymer coating of the invention and the smooth physical nature of said coating.
Figure 2B:
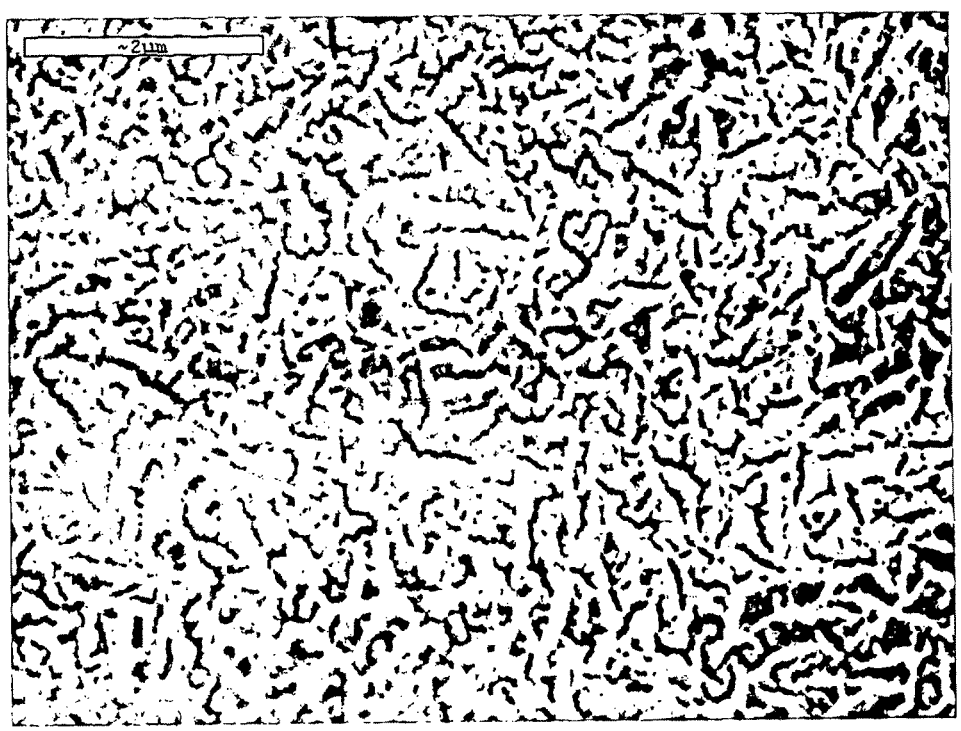
FIG. 2B shows an electron microscope image of a PTFE coating deposited by standard polymerization techniques, which has a structure in which fibrils are clearly visible.

FIG. 2A shows an electron microscope image of a plasma-polymerized fluoropolymer coating of the invention and the smooth physical nature of said coating. FIG. 2B shows an electron microscope image of a PTFE coating deposited by standard polymerization techniques, which has a structure in which fibrils are clearly visible.

FIG. 3 shows an electrical assembly comprising a substrate 1 comprising an insulating material, a plurality of conductive tracks 2 present on at least one surface of the substrate 1, electrical components 3 connected to at least one conductive track 2, and a continuous coating 4 comprising a plasma-polymerized polymer completely covering the at least one surface of the substrate 1, the plurality of conductive tracks 2 and the electrical components 3.

FIG. 4 shows an electrical assembly comprising a substrate 1 comprising an insulating material, a plurality of conductive tracks 2 present on at least one surface of the substrate 1, electrical components 3 connected to at least one conductive track 2 by bonds 5, and a continuous coating 4 comprising a plasma-polymerized polymer completely covering the at least one surface of the substrate 1, the plurality of conductive tracks 2, the electrical components 3, and the bonds 5.

FIG. 5 shows an electrical assembly comprising a substrate 1 comprising an insulating material, a plurality of conductive tracks 2 present on at least one surface of the substrate 1, electrical components 3 connected to at least one conductive track 2, a continuous coating 4 comprising a plasma-polymerized polymer completely covering the at least one surface of the substrate 1, the plurality of conductive tracks 2 and the electrical components 3, and a first additional continuous coating 7 comprising a plasma-polymerized polymer completely covering the continuous coating 4.

FIG. 6 shows an electrical assembly comprising a substrate 1 comprising an insulating material, a plurality of conductive tracks 2 present on at least one surface of the substrate 1, electrical components 3 connected to at least one conductive track 2, and a continuous coating 4 comprising a plasma-polymerized polymer completely covering the at least one surface of the substrate 1, the plurality of conductive tracks 2 and the electrical components 3, and a coating 8 of an epoxy resin, acrylic resin, or silicone resin deposited between at least a portion of the continuous coating 4 and at least a portion of the substrate 1, the plurality of conductive tracks 2 and the electrical components 3.

FIG. 7 shows an electrical assembly comprising a substrate 1 comprising an insulating material, a plurality of conductive tracks 2 present on at least one surface of the substrate 1, electrical component 3 connected to at least one conductive track 2 by a bond 5, a continuous coating 4 comprising a plasma-polymerized polymer completely covering the at least one surface of the substrate 1, the plurality of conductive tracks 2, the electrical components 3 and the bond 5, and a surface-finish coating 6 comprising a halohydrocarbon is deposited between the continuous coating 4 and the at least one surface of the substrate 1 and the plurality of conductive tracks 2. The electrical components 3 are connected to the conductive track 2 through the surface-finish coating 6 via a bond 5 which abuts the surface-finish coating 5.

Figure 8:
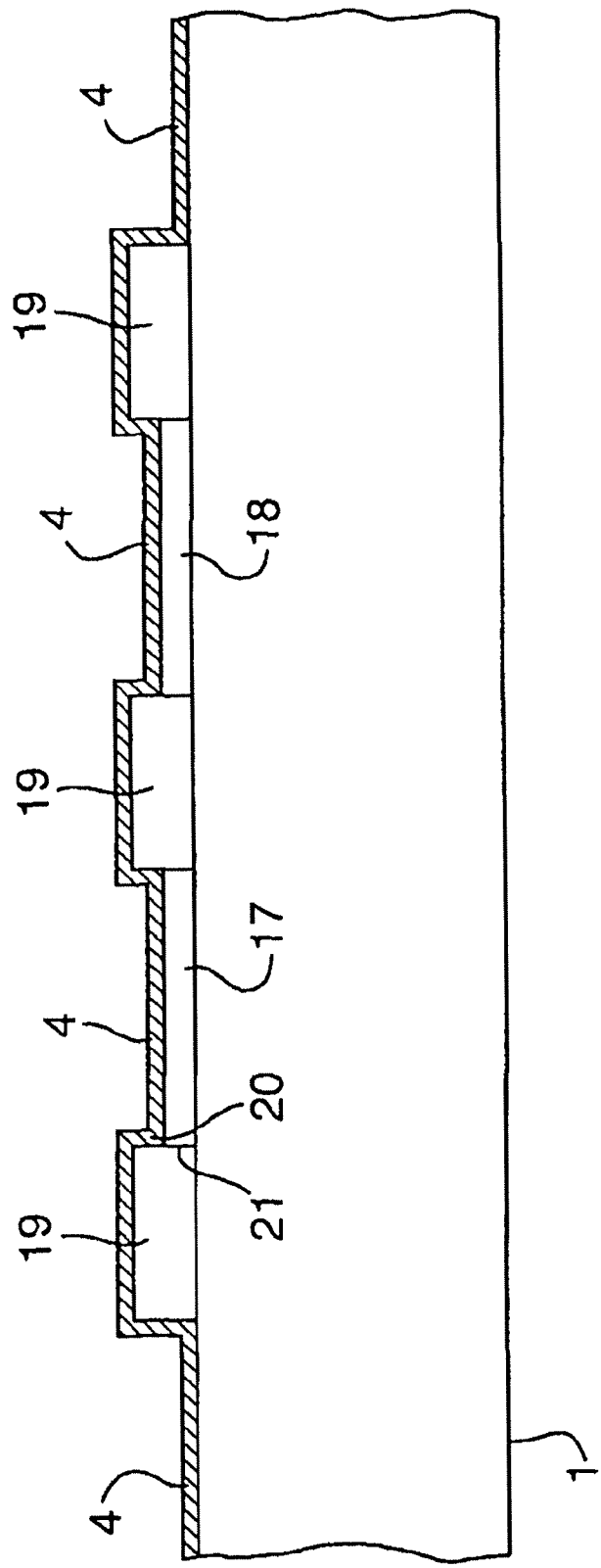
FIG. 8 shows an electro-optical assembly of certain embodiments.

FIG. 8 shows an electro-optical assembly comprising a substrate 1 comprising an insulating material, a plurality of conductive tracks 17, 18 present on at least one surface of the substrate 1, electro-optical components 19 connected to at least one conductive track 17, 18, and a continuous coating 4 comprising a plasma-polymerized polymer completely covering the at least one surface of the substrate 1, the plurality of conductive tracks 17, 18 and the electrical electro-optical components 19. The conductive track 17 is an optically conductive track, such as an optical fiber. The conductive track 18 is an electrically conductive track. The refractive index of the region of the coating 20 by the optical interconnect 21 is controlled.

Figure 9:
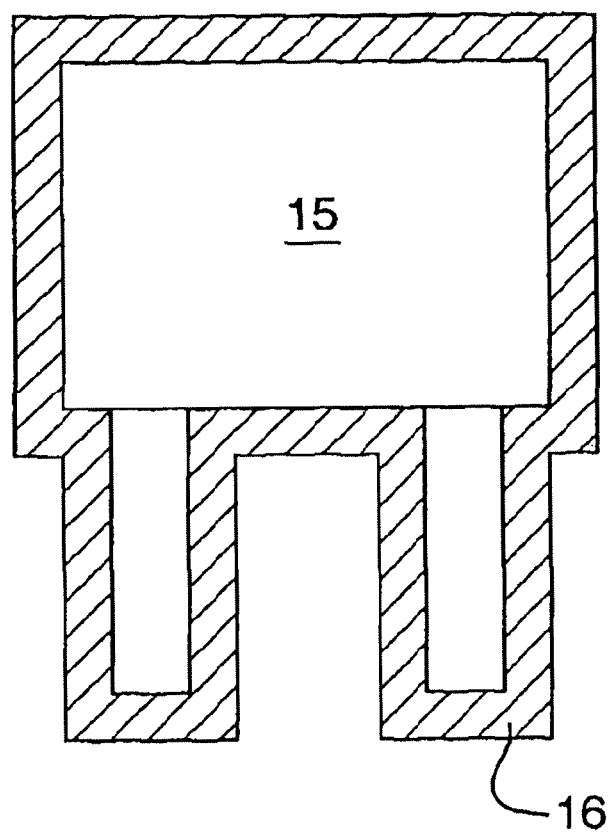
FIG. 9 shows an electrical component of certain embodiments.

FIG. 9 shows an electrical component 15 which is completely covered with a continuous coating comprising a plasma-polymerized polymer 16.

Figure 10:
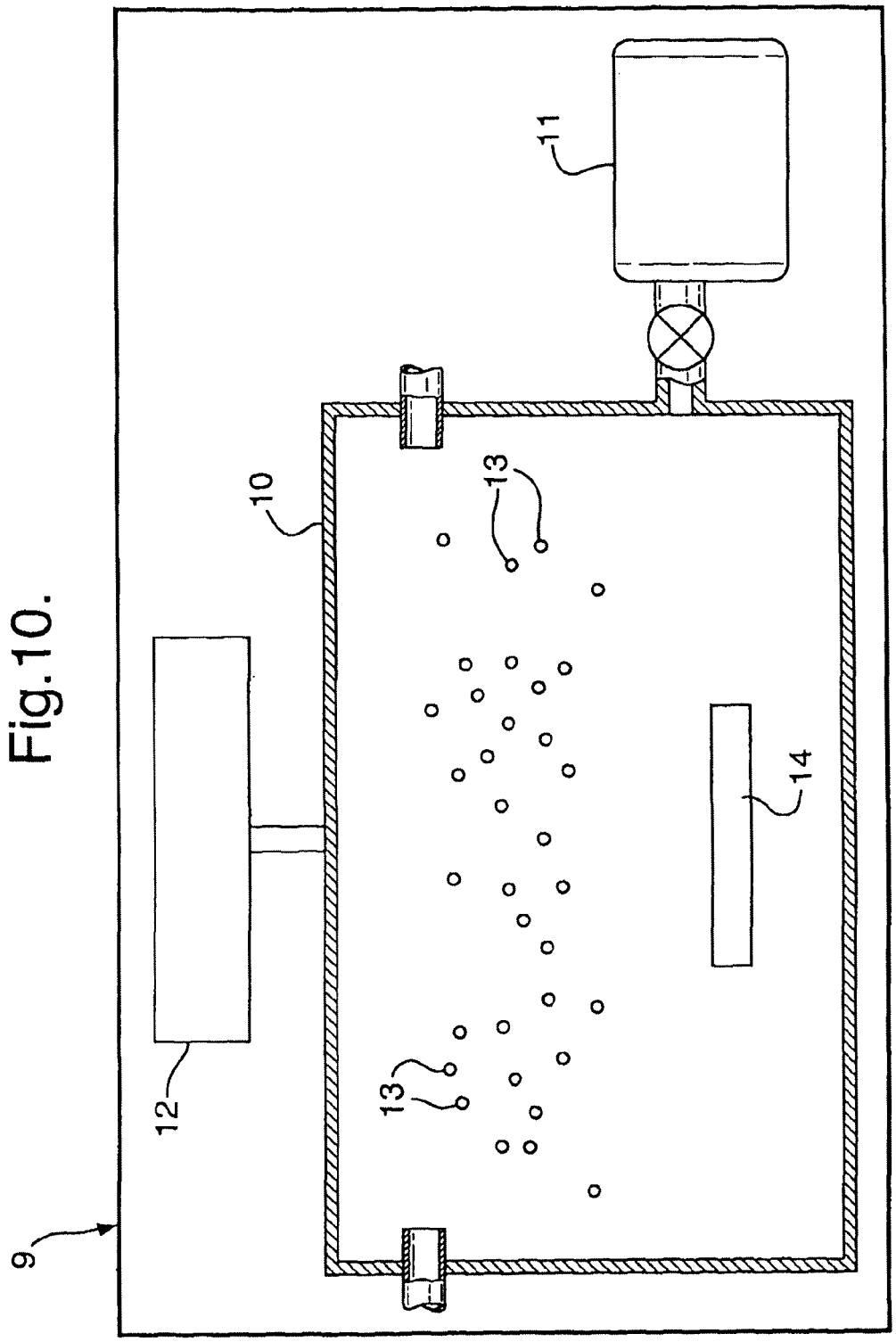
FIG. 10 shows an example of an apparatus that can be used to form the plasma-polymerized polymer coating of the invention.

FIG. 10 shows an example of an apparatus which can be used to form the plasma-polymerized polymer coating of the invention. In this example, the reactor 9 has a chamber 10 connected to a vacuum system 11 and an energy source 12. Precursor compounds are ionized/and or decomposed by the plasma to form active species 13 which then react at the surface of the assembly 14 to form a continuous plasma-polymerized polymer coating.

Figure 11A:
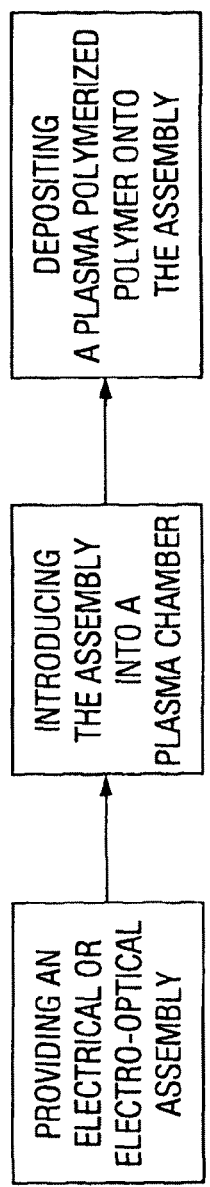
FIGS. 11A, 11B, and 11C are flow-charts showing the methods certain embodiments.
Figure 11B:
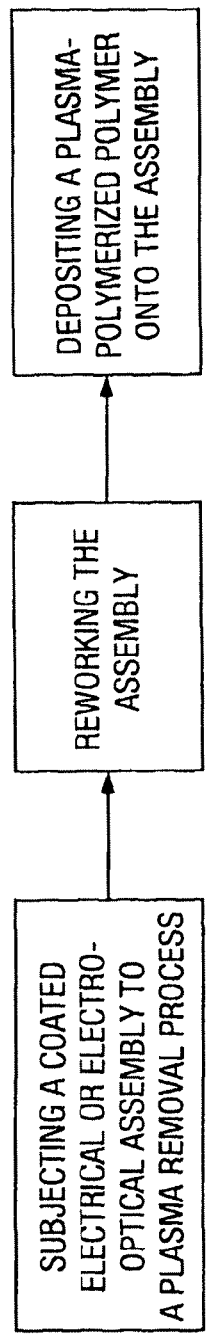
Figure 11C:
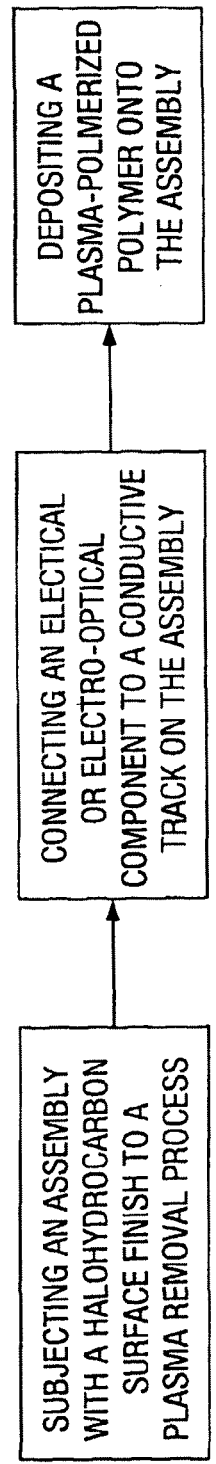

FIGS. 11A, 11B, and 11C are flow-charts showing certain embodiments of the methods described above.

Figure 12:
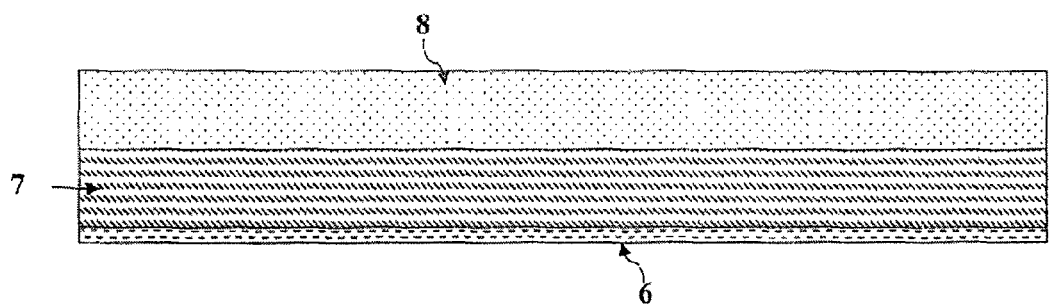
FIG. 12 shows a cross section of an exemplary conformal coating of certain embodiments.

FIG. 12 shows a cross section through an exemplary conformal coating 4, similar to the coating illustrated in FIG. 3. The conformal coating includes a first polymer 7 obtainable by plasma polymerization of a compound of formula (I) and deposition of the resulting polymer onto the surface 6 of the electrical assembly, and a second polymer 8 obtainable plasma polymerization of a fluorohydrocarbon and deposition of the resulting polymer onto the polymer 7.

Figure 13:
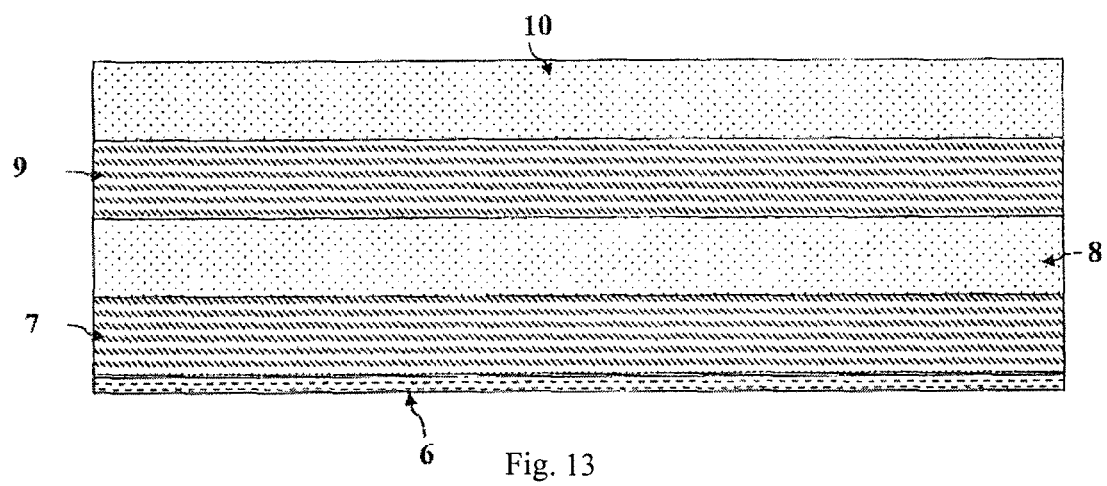
FIG. 13 shows a cross section of another exemplary conformal coating of certain embodiments.

FIG. 13 shows a cross section through another exemplary conformal coating 4, similar to the coating illustrated in FIG. 3. The conformal coating includes a first polymer 7 obtainable by plasma polymerization of a first compound of formula (I) and deposition of the resulting polymer onto the surface 6 of the electrical assembly, a second polymer 8 obtainable by plasma polymerization of a first fluorohydrocarbon and deposition of the resulting polymer onto the polymer 7, a third polymer 9 obtainable by plasma polymerization of a second compound of formula (I) and deposition of the resulting polymer onto the polymer 8, and a fourth polymer 10 obtainable by plasma polymerization of a second fluorohydrocarbon and deposition of the resulting polymer onto the polymer 9.

Figure 14:
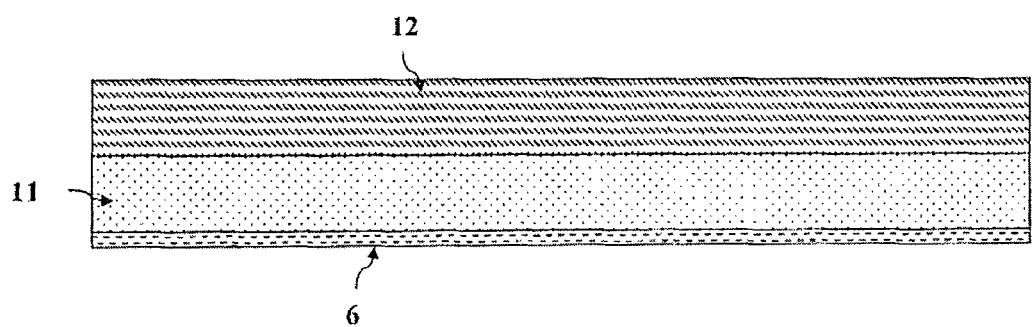
FIG. 14 shows a cross section of another exemplary conformal coating of certain embodiments.

FIG. 14 shows a cross section through another exemplary conformal coating 4, similar to the coating illustrated in FIG. 3. The conformal coating includes a first polymer 11 obtainable by plasma polymerization of a fluorohydrocarbon and deposition of the resulting polymer onto the surface 6 of the electrical assembly, and a second polymer 12 obtainable plasma polymerization of a compound of formula (I) and deposition of the resulting polymer onto the polymer 11.

Figure 15:
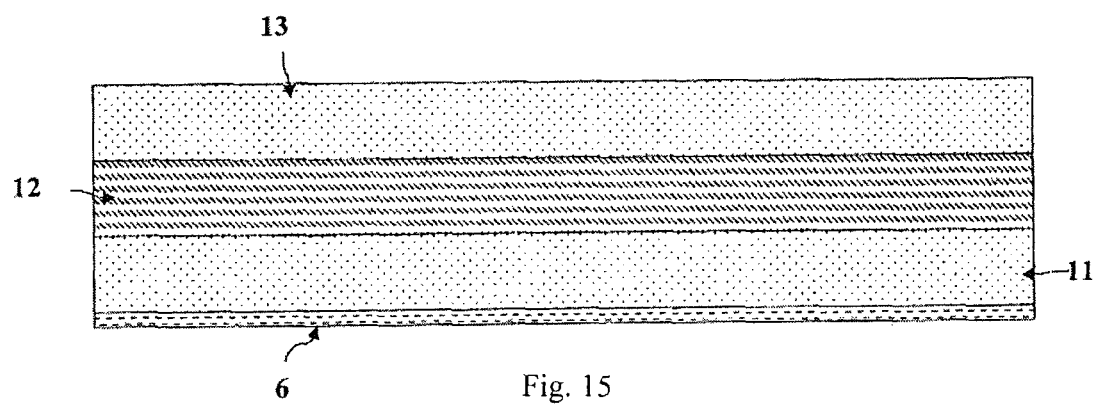
FIG. 15 shows a cross section of another exemplary conformal of certain embodiments.

FIG. 15 shows a cross section through another exemplary conformal coating 4, similar to the coating illustrated in FIG. 3. The conformal coating includes a first polymer 11 obtainable by plasma polymerization of a first fluorohydrocarbon and deposition of the resulting polymer onto the surface 6 of the electrical assembly, a second polymer 12 obtainable by plasma polymerization of a compound of formula (I) and deposition of the resulting polymer onto the polymer 11, and a third polymer 13 obtainable by plasma polymerization of a second fluorohydrocarbon and deposition of the resulting polymer onto the polymer 12.

Aspects of the present disclosure will now be described with reference to the Examples.

EXAMPLE 1

XPS Analysis of a Plasma-Polymerized Fluorohydrocarbon

An epoxy laminate substrate was coated with a plasma-polymerized fluorohydrocarbon. This laminate was cut to yield a sample size of approximately 1 cm square and introduced to the sample chamber of a Thermo-Scientific ESCALAB 250 X-Ray Photoelectron Spectrometer.

The chamber was pumped down to an operating pressure of $10^{-10}$ Torr and then the sample was transferred to the analyzing chamber. A monochromatic X-ray beam was incident on the surface and the photoelectrons emitted by the sample were collected and analyzed.

A broad signal scan was conducted to capture all of the elements on the surface, and then a further high resolution scan of the C1s peak was conducted to determine the fine structure of the peak and the chemical structure of the sample.

The results are displayed in FIG. 1A.

EXAMPLE 2

Preparation of Coated Assemblies

Assemblies were coated in Runs 1 to 10 using the precursors and plasma-polymerization conditions displayed in Table 1 below.

TABLE 1

| Run | Precursor | Flow (sccm) | Power (kW) | Base Pressure (mTorr) | Growth Time (mins) |
|---|---|---|---|---|---|
| 1 | $C_3F_6$ | 100 | 0.8 | 50 | 7 |
| 2 | $C_3F_6$ | 100 | 2.4 | 50 | 7 |
| 3 | $C_3F_6$ | 100 | 4.8 | 50 | 7 |
| 4 | $C_3F_6$ | 400 | 0.8 | 50 | 7 |
| 5 | $C_3F_6$ | 400 | 2.4 | 50 | 7 |
| 6 | $C_3F_6$ | 400 | 4.8 | 50 | 7 |
| 7 | $C_4F_8$ | 100 | 2.4 | 50 | 10 |
| 8 | $C_4F_8$ | 100 | 2.4 | 50 | 10 |
| 9 | $C_2F_3Cl$ | 100 | 2.4 | 50 | 10 |
| 10 | $C_2F_4Cl_2$ | 100 | 2.4 | 50 | 10 |

EXAMPLE 3

Preparation of Coated Assembly with 1,4-dimethylbenzene

An electrical assembly to be coated was placed into a plasma deposition chamber and the atmosphere was evacuated to 50 mTorr. 1,4-dimethylbenzene vapor was then introduced to the chamber at a flow rate of approximately 10 sccm using a mass flow controller. The RF generator was switched on at a power of 175 W and a plasma was formed. The 1,4-dimethylbenzene was ionized and then reacted with itself to form a continuous and conformal coating on the electrical assembly. Once the desired coating thickness had formed, the RF generator was switched off and the flow of 1,4-dimethylbenzene was stopped.

The chamber was brought to atmospheric pressure and opened and the electrical assembly with a conformal coating was removed.

EXAMPLE 4

Preparation of Coated Assembly with 1,4-dimethylbenzene and Hexafluoropropylene

An electrical assembly to be coated was placed into a plasma deposition chamber and the atmosphere was evacuated to 50 mTorr. 1,4-dimethylbenzene vapor was then introduced to the chamber at a flow rate of approximately 10 sccm using a mass flow controller. The RF generator was switched on at a power of 175 W and a plasma was formed. The 1,4-dimethylbenzene was ionized and then reacted with itself to form a continuous and conformal coating on the electrical assembly. Once the desired coating thickness had formed, the RF generator was switched off and the flow of 1,4-dimethylbenzene was stopped.

The vacuum in the chamber was maintained and hexafluoropropylene gas was then introduced to the chamber at a specific flow rate which was controlled at approximately 5 sccm using a mass flow controller. The RF generator was switched on at a power of 175 W and a plasma was formed. The hexafluoropropylene was ionized and then reacted with itself to form a continuous and conformal coating on the previous coating. Once the desired coating thickness had formed, the RF generator was switched off and the flow of hexafluoropropylene was stopped.

The chamber was brought to atmospheric pressure and opened and the electrical assembly with a conformal coating was removed.

EXAMPLE 5

Preparation of Coated Assembly with 1,4-dimethylbenzene and hexafluoropropylene

An electrical assembly to be coated was placed into a plasma deposition chamber and the atmosphere was evacuated to 50 mTorr. 1,4-dimethylbenzene vapor was then introduced to the chamber at a flow rate of approximately 10 sccm using a mass flow controller. The RF generator was switched on at a power of 175 W and a plasma was formed. The 1,4-dimethylbenzene was ionized and then reacted with itself to form a continuous and conformal coating on the electrical. Once the desired coating thickness had formed, the RF generator was switched off and the flow of paraxylene was stopped.

The vacuum in the chamber was maintained and hexafluoropropylene gas was then introduced to the chamber at a flow rate of approximately 5 sccm using a mass flow controller. The RF generator was switched on at a power of 175 W and a plasma was formed. The hexafluoropropylene was ionized and then reacted with itself to form a continuous and conformal coating on the previous coating. Once the desired coating thickness had formed, the RF generator was switched off and the flow of hexafluoropropylene was stopped.

While maintaining the vacuum, two further layers were added, the first from 1,4-dimethylbenzene and the second from hexafluoropropylene, using the same methods as described above.

The chamber was brought to atmospheric pressure and opened and the electrical assembly with a conformal coating removed.

EXAMPLE 6

Preparation of Coated Assembly with 1,4-dimethylbenzene and hexafluoropropylene

An electrical assembly to be coated was placed into a plasma deposition chamber and the atmosphere was evacuated to 50 mTorr. Hexafluoropropylene gas was then introduced to the chamber at a flow rate of approximately 5 sccm using a mass flow controller. The RF generator was switched on at a power of 175 W and a plasma was formed. The hexafluoropropylene was ionized and then reacted with itself to form a continuous and conformal coating on the electrical assembly. Once the desired coating thickness had formed, the RF generator was switched off and the flow of hexafluoropropylene was stopped.

The vacuum in the chamber was maintained and 1,4-dimethylbenzene vapor was then introduced to the chamber at a flow rate of approximately 10 sccm using a mass flow controller. The RF generator was switched on at a power of 175 W and a plasma was formed. The paraxylene was ionized and then reacted with itself to form a continuous and conformal coating on the previous coating. Once the desired coating thickness had formed, the RF generator was switched off and the flow of 1,4-dimethylbenzene was stopped.

The vacuum in the chamber was maintained and hexafluoropropylene gas was then introduced to the chamber at a flow rate of 5 sccm using a mass flow controller. The RF generator was switched on at a power of 175 W and a plasma was formed. The hexafluoropropylene was ionized and then reacted with itself to form a continuous and conformal coating on the previous coating. Once the desired coating thickness had formed, the RF generator was switched off and the flow of hexafluoropropylene was stopped.

The chamber was brought to atmospheric pressure and opened and the electrical assembly with a conformal coating removed.

EXAMPLE 7

Fourier Transform Infrared (FTIR) Spectroscopy

Figure 16:
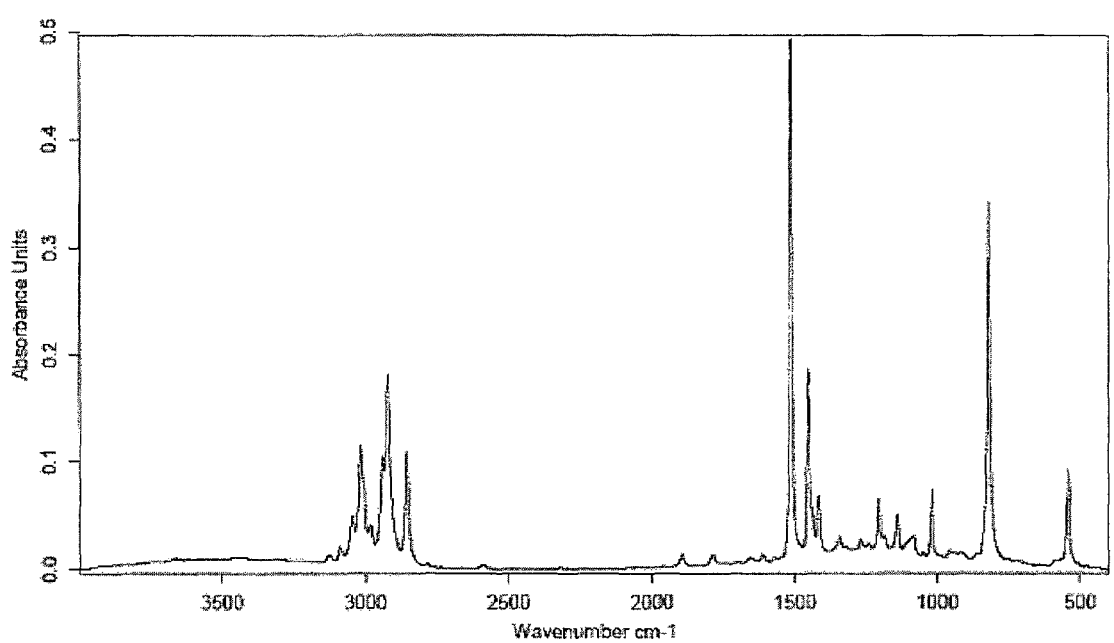
FIGS. 16 to 18 show spectra from Fourier transform infrared spectroscopy relative to certain embodiments.
Figure 17:
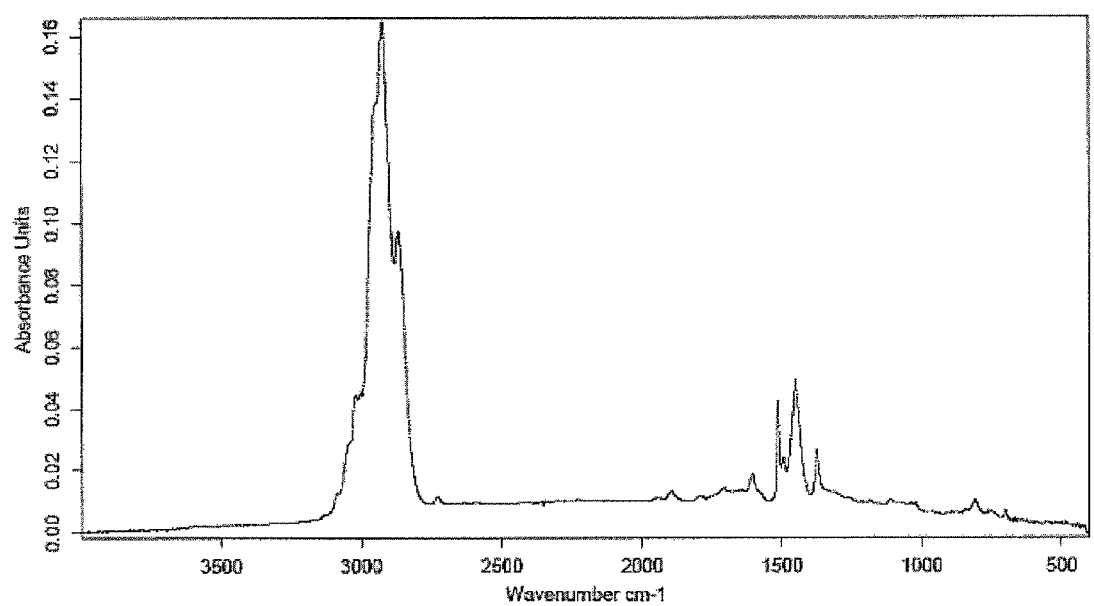

Fourier transform infrared (FTIR) spectroscopy was carried out on the following conformal coatings:
1. A conventional parylene conformal coating. The spectrum is shown in FIG. 16.
2. The conformal coating prepared in Example 3 above, by plasma polymerization of 1,4-dimethylbenzene. The spectrum is shown in FIG. 17.
3. The multilayer coatings prepared in Examples 4 to 6, which contain plasma polymerized 1,4-dimethylbenzene and plasma polymerized hexafluoropropylene. The spectrum is shown in FIG. 18.

Figure 18:
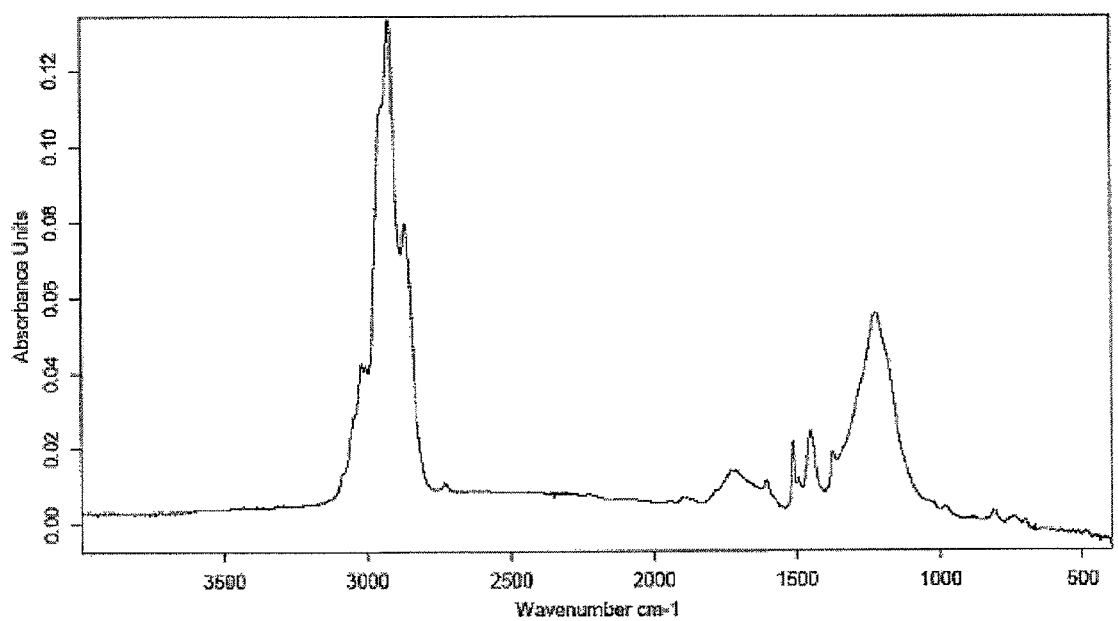

FIGS. 16 to 18 highlight how the coating obtainable by plasma polymerization of 1,4-dimethylbenzene is different from conventional parylene.

Parylene is a polymer with a regular, well defined structure which gives rise to sharp peaks in the spectrum of FIG. 16. Of particular interest is the cluster of peaks centered around 3000 $cm^{-1}$. The peaks to the right of 3000 $cm^{-1}$ represent the aliphatic C—H stretches, while those to the left are the aromatic C—H stretches due to the hydrogen atoms attached to the benzene ring.

FIG. 17 shows that plasma polymerized 1,4-dimethylbenzene is less well defined than parylene, as is characteristic of plasma polymers in general. This results in peaks which are broader, and less sharp. Additionally, the ratio of aromatic to aliphatic C—H stretches has changed considerably, because some of the ring structure in the 1,4-dimethylbenzene precursor has been lost.

As expected, FIG. 18 contains peaks similar to those in FIG. 17. An additional absorption at around 1200 $cm^{-1}$ is observed, which is due to the C—F stretch in the plasma polymerized hexafluoropropylene.

EXAMPLE 8

Plasma Removal Process

An electrical assembly that had been coated with a plasma-polymerized fluorohydrocarbon was introduced to a plasma chamber. The chamber was pumped down to an operating pressure of 250 mTorr and oxygen gas was introduced at a flow rate of 2500 sccm. The gas was allowed to flow through the chamber for 30 seconds and then the plasma generator was switched on at a frequency of 40 kHz and a power of 3 kW. The assembly was exposed to the active plasma for a time period of 5 minutes, after which the plasma generator was switched off and the chamber brought back to atmospheric pressure.

The assembly was removed from the plasma chamber and the removal of the plasma polymer coating was verified using a Bruker FTIR spectrometer. The absence of the characteristic CF stretching peak at 1250 nm indicated that the fluoropolymer had been completely removed.

What is claimed is:

1. An electrical or electro-optical assembly comprising:
   a substrate comprising an insulating material, at least one conductive track present on at least one surface of the substrate, at least one electrical or electro-optical component connected to at least one of the at least one conductive track;
   a continuous coating comprising a plasma polymerized polymer completely covering the insulating material, the at least one conductive track present on at least one surface of the substrate, and the at least one electrical or electro-optical component connected to at least one of the at least on conductive track; and
   a second continuous coating comprising a second plasma polymerized polymer which completely covers the continuous coating, wherein:
      the plasma polymerized polymer is obtainable by plasma polymerizing a xylene compound; and
      the second plasma polymerized polymer is obtainable by plasma polymerizing 1,4 dimethylbenzene.

2. The electrical or electro-optical assembly of claim 1, wherein the xylene compound is 1,4 dimethylbenzene.

3. The electrical or electro-optical assembly of claim 1, wherein the electrical or electro-optical component is an electrical component and the at least one conductive track is an electrically conductive track.

4. The electrical or electro-optical assembly of claim 1, wherein the electrical or electro-optical component is an electro-optical component and the at least one conductive track is an electrically conductive or optically conductive track.

5. The electrical or electro-optical assembly of claim 1, wherein the electrical or electro-optical component is connected to at least one of the at least one conductive track by at least one bond and the continuous coating completely covers the at least one bond.

6. The electrical or electro-optical assembly of claim 1, wherein at least one of the at least one conductive track further comprises at least one external-contact and the continuous coating completely covers the at least one external-contact.

7. The electrical or electro-optical assembly of claim 4, further comprising an optical component connected to the optically conductive track.

8. The electrical or electro-optical assembly of claim 5, wherein the at least one bond is selected from the group consisting of a solder joint, a weld joint, a wire-bond joint, a conductive adhesive joint, a crimp connection, and a press-fit joint.

9. An electrical or electro-optical assembly comprising:
   a substrate comprising an insulating material, at least one conductive track present on at least one surface of the substrate, at least one electrical or electro-optical component connected to at least one of the at least one conductive track;
   a continuous coating comprising a plasma polymerized polymer completely covering the insulating material, the at least one conductive track present on at least one surface of the substrate, and the at least one electrical or electro-optical component connected to at least one of the at least on conductive track; and
   a coating of an epoxy resin, an acrylic resin, a silicone resin, or a parylene deposited between at least a portion of the continuous coating of the plasma polymerized polymer and at least a portion of the substrate, wherein the plasma polymerized polymer is obtainable by plasma polymerizing a xylene compound.

10. The electrical or electro-optical assembly of claim 9, wherein the xylene compound is 1,4 dimethylbenzene.

11. The electrical or electro-optical assembly of claim 9, wherein the electrical or electro-optical component is an electrical component and the at least one conductive track is an electrically conductive track.

12. The electrical or electro-optical assembly of claim 9, wherein the electrical or electro-optical component is an electro-optical component and the at least one conductive track is an electrically conductive or optically conductive track.

13. The electrical or electro-optical assembly of claim 9, wherein the electrical or electro-optical component is connected to at least one of the at least one conductive track by at least one bond and the continuous coating completely covers the at least one bond.

14. The electrical or electro-optical assembly of claim 9, wherein at least one of the at least one conductive track further comprises at least one external-contact and the continuous coating completely covers the at least one external-contact.

15. The electrical or electro-optical assembly of claim 12, further comprising an optical component connected to the optically conductive track.

16. The electrical or electro-optical assembly of claim 13, wherein the at least one bond is selected from the group consisting of a solder joint, a weld joint, a wire-bond joint, a conductive adhesive joint, a crimp connection, and a press-fit joint.

17. A method for coating an electrical assembly with a continuous coating, the method comprising:
   providing an electrical or electro-optical assembly comprising a substrate comprising an insulating material, at least one conductive track present on at least one surface of the substrate, at least one electrical or electro-optical component connected to at least one of the at least one conductive track;
   depositing a continuous coating comprising a plasma polymerized polymer completely covering the insulating material, the at least one conductive track present on at least one surface of the substrate, and the at least one electrical or electro-optical component connected to at least one of the at least on conductive track; and
   depositing a second continuous coating comprising a second plasma polymerized polymer which completely covers the continuous coating, wherein:
      the second plasma polymerized polymer is obtainable by plasma polymerizing 1,4 dimethylbenzene; and
      the plasma polymerized polymer is obtainable by plasma polymerizing a xylene compound.

18. The method of claim 17, wherein the plasma polymerized xylene is 1,4 dimethylbenzene.

19. The method of claim 17, wherein the electrical or electro-optical component is an electrical component and the at least one conductive track is an electrically conductive track.

20. The method of claim 17, wherein the electrical or electro-optical component is an electro-optical component and the at least one conductive track is an electrically conductive or optically conductive track.

21. The method of claim 17, wherein the electrical or electro-optical component is connected to at least one of the at least one conductive track by at least one bond and the continuous coating completely covers the at least one bond.

22. The method of claim 17, wherein at least one of the at least one conductive track further comprises at least one external-contact and the continuous coating completely covers the at least one external-contact.

23. The method of claim 21, wherein the at least one bond is selected from the group consisting of a solder joint, a weld joint, a wire-bond joint, a conductive adhesive joint, a crimp connection, and a press-fit joint.

24. A method for coating an electrical assembly with a continuous coating, the method comprising:
 providing an electrical or electro-optical assembly comprising a substrate comprising an insulating material, at least one conductive track present on at least one surface of the substrate, at least one electrical or electro-optical component connected to at least one of the at least one conductive track;
 depositing a continuous coating comprising a plasma polymerized polymer completely covering the insulating material, the at least one conductive track present on at least one surface of the substrate, and the at least one electrical or electro-optical component connected to at least one of the at least on conductive track; and
 depositing a coating of an epoxy resin, an acrylic resin, a silicone resin, or a parylene deposited between at least a portion of the continuous coating of the plasma polymerized polymer and at least a portion of the substrate, wherein the plasma polymerized polymer is obtainable by plasma polymerizing a xylene compound.

25. The method of claim 24, wherein the plasma polymerized xylene is 1,4 dimethylbenzene.

26. The method of claim 24, wherein the electrical or electro-optical component is an electrical component and the at least one conductive track is an electrically conductive track.

27. The method of claim 24, wherein the electrical or electro-optical component is an electro-optical component and the at least one conductive track is an electrically conductive or optically conductive track.

28. The method of claim 24, wherein the electrical or electro-optical component is connected to at least one of the at least one conductive track by at least one bond and the continuous coating completely covers the at least one bond.

29. The method of claim 24, wherein at least one of the at least one conductive track further comprises at least one external-contact and the continuous coating completely covers the at least one external-contact.

30. The method of claim 28, wherein the at least one bond is selected from the group consisting of a solder joint, a weld joint, a wire-bond joint, a conductive adhesive joint, a crimp connection, and a press-fit joint.

* * * * *